(12) United States Patent
Selvanayagam et al.

(10) Patent No.: US 12,381,554 B1
(45) Date of Patent: Aug. 5, 2025

(54) SUPERCONDUCTING PARAMETRIC INTERFEROMETERS FOR ISOLATION AND DIRECTIONAL AMPLIFICATION

(71) Applicant: International Business Machines Corporation, Armonk, NY (US)

(72) Inventors: Michael Karunendra Selvanayagam, Ossining, NY (US); Matthew Beck, Danbury, CT (US); Corrado P Mancini, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 24 days.

(21) Appl. No.: 18/609,030

(22) Filed: Mar. 19, 2024

(51) Int. Cl.
*H03K 17/92* (2006.01)
*G06N 10/40* (2022.01)

(52) U.S. Cl.
CPC ............. *H03K 17/92* (2013.01); *G06N 10/40* (2022.01)

(58) Field of Classification Search
CPC ...................................................... H03K 17/92
USPC .................................................. 327/527, 528
See application file for complete search history.

(56) References Cited

U.S. PATENT DOCUMENTS

| | | | |
|---|---|---|---|
| 8,421,460 B2 | 4/2013 | Hulbert | |
| 10,396,782 B2 | 8/2019 | Abdo | |
| 10,541,659 B2 | 1/2020 | Abdo et al. | |
| 10,629,978 B2 * | 4/2020 | Abdo | ................. H10N 60/0912 |
| 10,686,115 B2 | 6/2020 | Abdo | |
| 10,892,751 B2 | 1/2021 | Abdo | |
| 11,277,107 B2 | 3/2022 | Bell et al. | |
| 11,374,537 B2 | 6/2022 | Abdo | |
| 2021/0021245 A1 | 1/2021 | Frattini et al. | |
| 2021/0265964 A1 | 8/2021 | Miano et al. | |
| 2022/0182027 A1 | 6/2022 | Reilly | |
| 2023/0006626 A1 | 1/2023 | Naaman | |
| 2023/0163762 A1 | 5/2023 | Yamaji et al. | |

OTHER PUBLICATIONS

F. Kronwetter et al., "Quantum Microwave Parametric Interferometer," Cornell University Library, arXiv:2303.01026v1, Mar. 2, 2023, 6 pages.

(Continued)

*Primary Examiner* — Tomi Skibinski
(74) *Attorney, Agent, or Firm* — Erik Johnson; Ryan, Mason & Lewis, LLP

(57) ABSTRACT

A device comprises a superconducting parametric interferometric circuit, which comprises a signal input port and a signal output port, and a first parametric mixing circuit and a second parametric mixing circuit coupled in parallel between the signal input port and the signal output port. The signal input port configured to receive an input signal having a first frequency. The first parametric mixing circuit is configured to convert the input signal to a first output signal having a second frequency, and the second parametric mixing circuit is configured to convert the input signal to a second output signal having the second frequency. The superconducting parametric interferometric circuit is configured to constructively combine the first and second output signals at the signal output port to generate an output signal having the second frequency, and provide isolation of the signal input port from a signal which is present at the signal output port.

25 Claims, 15 Drawing Sheets

(56) References Cited

OTHER PUBLICATIONS

M. A. Beck, et al., "Wideband Josephson Parametric Isolator," Cornell University Library, arXiv:2212.08563v3, Jun. 23, 2023, 16 pages.

B. Abdo et al., "Josephson Directional Amplifier for Quantum Measurement of Superconducting Circuits", Physical Review Letters, pp. 167701:1-5, Apr. 25, 2014, vol. 112, No. 16.

B. Abdo et al., "Active Protection of a Superconducting Qubit with an Interferometric Josephson Isolator," Cornell University Library, arXiv: 1810.07234v1, Oct. 16, 2018, 19 pages.

V. Gordienko et al., "Design of an Interferometric Fiber Optic Parametric Amplifier for the Rejection of Unwanted Four-Wave Mixing Products," Optics Express, pp. 8226-8239, Feb. 21, 2023, vol. 31, No. 5.

D. M. Pozar, "Microwave Engineering," 4th Edition, John Wiley and Sons, 2012, Chapter 9, pp. 451-495.

B. J. Chapman et al., "Widely Tunable On-chip microwave Circulator for Superconducting Quantum Circuits,", Cornell University Library, arXiv: 1707.04565v2, Nov. 6, 2017, 16 pages.

O. Naaman et al., "Synthesis of Parametrically-coupled Networks," Cornell University Library, arXiv:2109.11628v4, Apr. 27, 2022, 37 pages.

B. J. Chapman et al., "Design of an On-chip Superconducting Microwave Circulator with Octave Bandwidth," Cornell University Library, arXiv:1809.08747v1, Sep. 24, 2018, 12 pages.

B. Abdo et al., "High-Fidelity Qubit Readout Using Interferometric Directional Josephson Devices," PRX Quantum, Dec. 28, 2021, pp. 040360:1-34, vol. 2, No. 4.

C. Macklin et al., "A Near-quantum-limited Josephson Traveling-wave Parametric Amplifier," Science, Sep. 3, 2015, pp. 307-310, vol. 350, No. 6258.

H. R. Nilsson et al., "Peripheral Circuits for Ideal Performance of a Travelling-wave Parametric Amplifier," arXiv:2310.11909v2, Jan. 30, 2024, 9 pages.

H. R. Nilsson et al., "Embedding Networks for Ideal Performance of a Travelling-wave Parametric Amplifier," arXiv:2310.11909v1, Oct. 18, 2023, 13 pages.

\* cited by examiner

200

800

Frequency of Amplified Idler Signal [GHz]

810

Frequency of Input Signal [GHz]

900

Frequency of Up-Converted Signal [GHz]

910

Frequency of input Signal [GHz]

1000

1200

SUPERCONDUCTING PARAMETRIC INTERFEROMETERS FOR ISOLATION AND DIRECTIONAL AMPLIFICATION

BACKGROUND

This disclosure relates generally to quantum computing and, in particular, microwave isolator devices and isolation techniques for use with, e.g., superconducting quantum computing systems. A superconducting quantum computing system is implemented using circuit quantum electrodynamics (QED) devices, which utilize the quantum dynamics of electromagnetic fields in superconducting circuits that include superconducting quantum bits, to generate and process quantum information. In general, superconducting quantum bits (qubits) are electronic circuits which are implemented using components such as superconducting tunnel junctions (e.g., Josephson junctions), inductors, and/or capacitors, etc., and which behave as quantum mechanical anharmonic (non-linear) oscillators with quantized states, when cooled to cryogenic temperatures. In addition, a flux-tunable qubit can be implemented using a superconducting quantum interference device (SQUID) to flux-tune a transition frequency of the qubit.

In a quantum computing system which implements superconducting qubits, a quantum chip comprises cryogenic hardware which includes microwave components for controlling and reading out the quantum states of the superconducting qubits. For example, the cryogenic hardware comprises qubit readout hardware that is configured to readout and amplify weak signals from superconducting qubits, while protecting the quantum states of superconducting qubits from noise and interference from other components in the quantum computing system. For example, non-reciprocal microwave devices such as ferrite-based microwave isolators are commonly utilized in, e.g., readout signal paths in a mixing chamber of the cryostat (dilution refrigerator) to isolate superconducting qubits. However, in the microwave regime (e.g., 1-10 GHz), such ferrite-based components are problematic for use in the mixing chamber of a quantum computing system as such ferrite-based components tend to be quite bulky, require significant shielding to prevent any stray magnetic field from leaking out, and also have a non-trivial amount of loss. As quantum computing systems scale in size beyond hundreds or thousands of superconducting qubits, the use of ferrite-based isolation components poses a limitation to system scaling and integration.

SUMMARY

Exemplary embodiments of the disclosure include superconducting parametric interferometer circuits and techniques for providing isolation and directional amplification in quantum computing systems.

For example, an exemplary embodiment includes a device which comprises a superconducting parametric interferometric circuit, which comprises a signal input port and a signal output port, and a first parametric mixing circuit and a second parametric mixing circuit coupled in parallel between the signal input port and the signal output port. The signal input port is configured to receive an input signal having a first frequency. The first parametric mixing circuit is configured to convert the input signal to a first output signal having a second frequency, and the second parametric mixing circuit is configured to convert the input signal to a second output signal having the second frequency. The superconducting parametric interferometric circuit is configured to constructively combine the first output signal and the second output signal at the signal output port to generate an output signal having the second frequency, and to provide isolation of the signal input port from a signal which is present at the signal output port.

Advantageously, the superconducting parametric interferometer circuit can be operated in a continuous wave mode of operation to provide broadband isolation or broadband directional amplification in, e.g., qubit readout signal chain, in place of using ferrite-based isolation devices.

In another exemplary embodiment, as may be combined with the preceding paragraphs, the superconducting parametric interferometric circuit comprises an interferometric isolator circuit which is configured to provide unity gain of the output signal, and to provide isolation by dissipating the signal which is present at the signal output port, in a terminated port of the superconducting parametric interferometric circuit.

In another exemplary embodiment, as may be combined with the preceding paragraphs, the superconducting parametric interferometric circuit comprises an interferometric directional amplifier circuit which is configured to provide an amplified output signal having the second frequency at the signal output port, and to provide isolation by dissipating the signal which is present at the signal output port, in a terminated port of the superconducting parametric interferometric circuit.

In another exemplary embodiment, as may be combined with the preceding paragraphs, the first parametric mixing circuit and the second parametric mixing circuit each comprise a parametric frequency converter circuit that is configured to one of: up-convert the first frequency to the second frequency and down-convert the first frequency to the second frequency.

In another exemplary embodiment, as may be combined with the preceding paragraphs, the first parametric mixing circuit and the second parametric mixing circuit each comprise a parametric amplifier circuit.

In another exemplary embodiment, as may be combined with the preceding paragraphs, the first parametric mixing circuit is driven by a first pump signal and the second parametric mixing circuit is driven by a second pump signal, wherein the first pump signal and the second pump signal have a same frequency and one of: a same phase and a phase offset.

Another exemplary embodiment includes a device which comprises a superconducting interferometric isolation circuit comprising a signal input port, a signal output port, a frequency conversion circuit, and a delay circuit. The signal input port is configured to receive an input signal having a first frequency. The frequency conversion circuit comprises a first parametric frequency converter circuit and a second parametric frequency converter circuit, which are serially cascaded. The delay circuit is coupled in parallel with the frequency conversion circuit. The delay circuit is configured to delay the input signal to generate a first output signal having the first frequency with a first phase. The frequency conversion circuit is configured to generate a second output signal having the first frequency and a second phase. The superconducting interferometric isolation circuit is configured to constructively combine the first output signal and the second output signal at the signal output port to generate an output signal having the first frequency, and to provide isolation of the signal input port from a signal which is present at the signal output port.

In another exemplary embodiment, as may be combined with the preceding paragraphs, the delay circuit comprises a passive delay line.

In another exemplary embodiment, as may be combined with the preceding paragraphs, the delay circuit comprise a passive filter circuit.

In another exemplary embodiment, as may be combined with the preceding paragraphs, one of the first parametric frequency converter circuit and the second parametric frequency converter circuit comprises a parametric frequency up-converter circuit, and the other of the first parametric frequency converter circuit and the second parametric frequency converter circuit comprises a parametric frequency down-converter circuit.

In another exemplary embodiment, as may be combined with the preceding paragraphs, first parametric frequency converter circuit is driven by a first pump signal and the second parametric frequency converter circuit is driven by a second pump signal, wherein the first pump signal and the second pump signal have a same frequency and one of: a same phase and a phase offset.

Another exemplary embodiment includes a device which comprises a superconducting parametric interferometric circuit comprising a first hybrid coupler, a second hybrid coupler, a first parametric mixing circuit, and a second parametric mixing circuit. The first hybrid coupler comprises a signal input port which is configured to receive an input signal having a first frequency, and the second hybrid coupler comprises a signal output port. The first parametric mixing circuit and the second parametric mixing circuit are coupled in parallel between the first hybrid coupler and the second hybrid coupler. The first hybrid coupler is configured to divide the input signal into a first input signal having the first frequency, and a second input signal having the first frequency. The first parametric mixing circuit is configured to convert the first input signal to a first output signal having a second frequency. The second parametric mixing circuit is configured to convert the second input signal to a second output signal having the second frequency. The second hybrid coupler is configured to combine the first output signal and the second output signal at the signal output port to generate an output signal having the second frequency.

Another exemplary embodiment includes a device which comprises a superconducting interferometric isolation circuit comprising a first hybrid coupler, a second hybrid coupler, a frequency conversion circuit, and a delay circuit. The first hybrid coupler comprises a signal input port which is configured to receive an input signal having a first frequency. The second hybrid coupler comprises a signal output port. The frequency conversion circuit comprises a first parametric frequency converter circuit and a second parametric frequency converter circuit, which are serially cascaded. The delay circuit is coupled in parallel with the frequency conversion circuit between the first hybrid coupler and the second hybrid coupler. The delay circuit is configured to delay the input signal to generate a first output signal having the first frequency with a first phase, and the frequency conversion circuit is configured to generate a second output signal having the first frequency and a second phase. The second hybrid coupler is configured to constructively combine the first output signal and the second output signal at the signal output port to generate an output signal having the first frequency.

Another exemplary embodiment includes a system which comprises a quantum processor, and a readout signal path. The quantum processor comprises quantum bits. The readout signal path is configured to transmit signals that are readout from one or more of the quantum bits of the quantum processor. The readout signal path comprises a superconducting parametric interferometric circuit which comprises a signal input port, a signal output port, a first parametric mixing circuit, and a second parametric mixing circuit. The signal input port is configured to receive an input signal having a first frequency, wherein the input signal comprises a readout signal of at least one quantum bit. The first parametric mixing circuit and the second parametric mixing circuit are coupled in parallel between the signal input port and the signal output port. The first parametric mixing circuit is configured to convert the input signal to a first output signal having a second frequency. The second parametric mixing circuit is configured to convert the input signal to a second output signal having the second frequency. The superconducting parametric interferometric circuit is configured to constructively combine the first output signal and the second output signal at the signal output port to generate an output signal having the second frequency, and to provide isolation of the signal input port from a signal which is present at the signal output port.

Other embodiments will be described in the following detailed description of exemplary embodiments, which is to be read in conjunction with the accompanying figures.

DETAILED DESCRIPTION

Figure 1A:
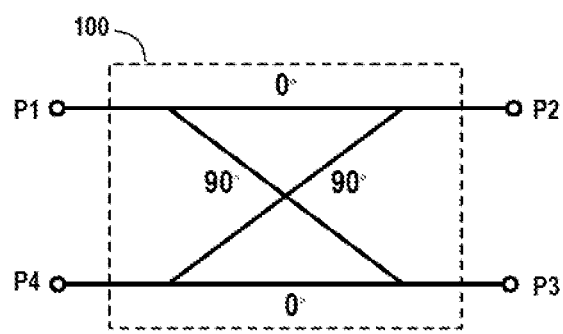
FIGS. 1A, 1B, and 1C schematically illustrate components that are utilized to construct superconducting parametric interferometer circuits, according to exemplary embodiments of the disclosure.

Exemplary embodiments of the disclosure will now be described in further detail with regard to superconducting parametric interferometer circuits for use with quantum computing systems. In particular, the exemplary superconducting parametric interferometer circuits disclosed herein include parametric interferometer circuits which are implemented at least in part using parametric frequency mixing circuits (e.g., parametric amplifier circuits, parametric frequency converter circuits) and are configured to provide isolation (alternatively referred to herein as an "interferometric isolator circuit" or "interferometric isolator"), as well as superconducting parametric interferometer circuits that are configured to provide directional amplification (alternatively referred to herein as an "interferometric directional amplifier circuit" or "interferometric directional amplifier"). In general, a parametric frequency mixing circuit is a type of circuit that is configured to convert energy from one frequency to another frequency using nonlinear elements (e.g., Josephson junctions). Moreover, an interferometer is a device which is configured to cause constructive interference and/or destructive interference of, e.g., microwave signals. The exemplary superconducting parametric interferometer circuits are implemented using an interferometric configuration of various components such microwave hybrid couplers and superconducting parametric frequency mixing circuits to realize broadband interferometric isolation and broadband interferometric directional amplification.

For example, exemplary embodiments of superconducting parametric interferometer circuits can be implemented using an interferometric configuration of Josephson junction traveling-wave parametric circuits (JJTWPCs) such as, e.g., Josephson traveling-wave parametric amplifier (JTWPA) circuit, and Josephson traveling-wave frequency converter (JTWFC) circuits, the JTWPA and JTWFC circuits are particular types of JJTWPCs. In other embodiments, superconducting parametric interferometer circuits can be implemented using an interferometric configuration of SQUID-based parametric amplifiers or SQUID-based parametric frequency converters.

In some embodiments, superconducting parametric interferometer circuits can be configured as interferometric isolator circuits to provide isolation between cryogenic components in a dilution refrigeration system. For example, a superconducting parametric interferometer circuit can be implemented in a qubit readout signal chain and configured to provide broadband isolation between superconducting qubits of a quantum processor and readout circuitry, when reading and measuring the quantum states of the superconducting qubits, either singularly or in a multiplexed configuration. In other embodiments, superconducting parametric interferometer circuits can be configured as interferometric directional amplifier circuits (e.g., directional quantum-limited amplifiers (QLAs)) to amplify low power signals in a cryogenic environment. For example, a superconducting parametric interferometer circuit can be implemented as a QLA in a qubit readout signal chain and configured to provide broadband directional amplification to amplify qubit readout signals with good signal-to-noise ratios, thereby allowing higher fidelity qubit measurements and lower power qubit measurements. In addition, a broadband interferometric directional amplifier circuit implemented in a qubit readout signal chain not only provides amplification but also isolation between superconducting qubits and the readout circuitry. Advantageously, operating a superconducting parametric interferometer circuit in a continuous wave mode of operation enables the realization of broadband isolation and directional amplification in, e.g., qubit readout signal chain in place of using ferrite-based isolation devices, in a multiplexed superconducting quantum computing readout signal chain.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise quantum circuit elements (e.g., quantum processors, quantum bits, Josephson junction devices, Josephson parametric converters (JPCs), quantum-limited amplifiers (QLAs), qubit coupler circuitry, Josephson multipole multiband isolator circuits, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

As noted above, the exemplary superconducting parametric interferometer circuits disclosed herein are implemented using an interferometric configuration of various components such as microwave hybrid couplers and superconducting parametric circuits to realize broadband isolation and directional amplification. For example, FIGS. 1A, 1B, and IC schematically illustrate components that are utilized to construct superconducting parametric interferometer circuits, according to exemplary embodiments of the disclosure. In particular, FIG. 1A schematically illustrates a hybrid coupler 100, FIG. 1B schematically illustrates a parametric frequency converter 110, and FIG. 1C schematically illustrates a parametric amplifier 120, which are utilized to implement various interferometric configurations of broadband isolators and directional quantum-limited amplifiers, according to exemplary embodiments of the disclosure.

Figure 1B:
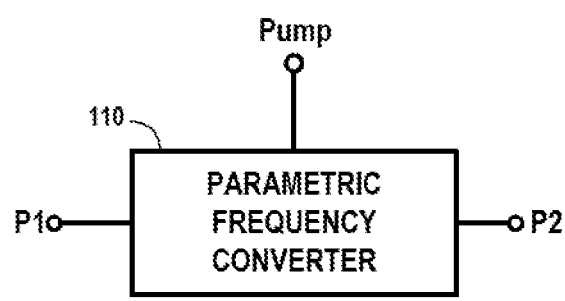
Figure 1C:
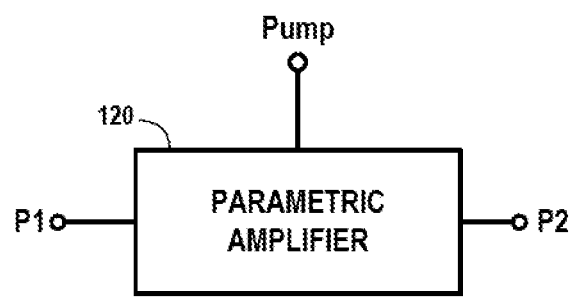

Referring to FIG. 1A, the hybrid coupler 100 comprises a passive microwave circuit which can be configured to operate as a power splitter or a power combiner. In particular, the hybrid coupler 100 comprises a four-port 90-degree (quadrature) hybrid coupler which comprises a first port P1, a second port P2, a third port P3, and a fourth port P4. In some embodiments, the hybrid coupler 100 is configured as a power splitter that is utilized to equally split the power of an input microwave signal, which is applied to a given input port, into two microwave signals that are output from two output ports with a phase difference of 90°. For example, assume a microwave signal is input to the first port P1 (with the fourth port P4 terminated), the hybrid coupler 100 will split the power of the input microwave signal into two microwave signals that are output from the second and third ports P2 and P3, where the two output signals each have the same power (e.g., 50% of the input power), but a phase difference of 90°.

In other embodiments, the hybrid coupler 100 is configured as a power combiner that is utilized to combine microwave signals that are input to two ports of the hybrid coupler 100, and output a combined signal from at least one of the ports. For example, assume that a first microwave signal and a second microwave signal are input to the second port P2 and the third port P3, respectively. Depending on the respective phases of the input first and second microwave signals, the signals will be combined (via constructive or destructive interference) and output from the first port P1 or the fourth port P4 or split between the first and fourth ports P1 and P4.

As explained in further detail below, an exemplary superconducting parametric interferometer circuit is configured (i) to implement an instance of the hybrid coupler 100 as a power splitter at an input of the superconducting parametric interferometer circuit, and to (ii) to implement an instance of the hybrid coupler 100 as a power combiner at an output of the superconducting parametric interferometer circuit. The hybrid coupler 100 can be designed to provide broadband operation using microwave engineering techniques that are well-known to those of ordinary skill in the art. It is to be noted that while exemplary embodiments of the disclosure are discussed in the context of utilizing 0-degree hybrid couplers, other embodiments are implemented using other equivalent microwave power splitters or couplers such as 180-degree hybrid couplers. In such instances, the phase requirements of the exemplary superconducting parametric interferometer circuits will vary based on the type of hybrid couplers utilized to achieve the requisite signal phases for constructive and destructive interference at the ports, as needed, for the desired circuit functionality.

Next, referring to FIG. 1B, the parametric frequency converter 110 is a circuit that is configured to convert an input signal at one frequency to an output signal at another frequency using a nonlinear process, i.e., a parametric frequency mixing process. The parametric frequency converter 110 comprises a first port P1, a second port P2, and a control port (referred to herein as Pump port). The Pump port receives a pump signal which comprises a microwave tone with a pump frequency $f_p$ (or angular frequency $\omega_p=2\pi f_p$), wherein the pump signal is configured to modulate the properties of nonlinear elements of the parametric frequency converter 110 to perform a parametric frequency conversion process. The parametric frequency converter 110 can be configured as a frequency up-converter circuit or a frequency down-converter circuit.

For example, assume that a microwave input signal with a frequency $f_s$ (or angular frequency $\omega_s=2\pi f_s$) is applied to the first port P1, and a pump signal with a frequency $f_p$ is applied to the Pump port. The parametric frequency converter 110 will output either an up-converted signal or a down-converted signal with a frequency $f_c$ (or angular frequency $\omega_c=2\pi f_c$), depending on whether the parametric frequency converter 110 is configured as a frequency up-converter or a frequency down-converter. Moreover, depending on the type of parametric frequency mixing (e.g., three-wave mixing or four-wave mixing) that is implemented by the parametric frequency converter 110, for an up-converter configuration, an upconverted signal will have a frequency $f_c=f_s+f_p$ (for three-wave mixing) or $f_c=f_s+2f_p$ (for four-wave mixing). On the other hand, for a down-converter configuration, a down-converted signal will have a frequency $f_c=f_s-f_p$ (for three-wave mixing) or $f_c=f_s-2f_p$ (for four-wave mixing).

Moreover, in all configurations, the frequency conversion process of the parametric frequency converter 110 results in the phase of the pump signal being imparted to the up-converted signal or down-converted signal. In particular, the phase of the up-converted signal or down-converted signal is shifted in phase proportional to the phase of the pump signal.

While FIG. 1B illustrates an exemplary embodiment in which the parametric frequency converter 110 comprises one Pump port, depending on the specific implementation, a parametric frequency converter may be operated using more than one pump tone such that the parametric frequency converter 110 can have more than one Pump port. Moreover, the method by which the pump signal is injected or coupled into the parametric frequency converter 110 will depend on the specific implementation, e.g., a separate circuit such as a diplexer, directional coupler, or a flux bias line for a SQUID. As explained in further detail below, the parametric frequency converter 110 can be implemented using various circuit architectures including, but not limited to, a traveling-wave frequency converter (TWFC) circuit, or a SQUID-based parametric frequency mixing circuit, exemplary embodiments of which will be described in further detail below in conjunction with FIGS. 2, 3A, and 3B.

Next, referring to FIG. 1C, the parametric amplifier 120 is a circuit that is configured to amplify an input signal through a parametric frequency mixing process that is performed by utilizing a pump signal to modulate nonlinear components of the parametric amplifier 120. The parametric amplifier 120 comprises a first port P1, a second port P2, and a control port (or Pump port). The parametric amplifier 120 receives an input signal on, e.g., the first port P1, and outputs an amplified signal from the second port P2, wherein a pump signal applied to the Pump port provides the power for amplifying the input signal. Further, as a result of the parametric frequency mixing and amplification process, the parametric amplifier 120 generates an amplified "idler" signal, which is output from the second port P2 along with the amplified signal.

More specifically, assume that a microwave input signal with a frequency $f_s$ (or angular frequency $\omega_s=2\pi f_s$) is applied to the first port P1, and a pump signal with a frequency $f_p$ is applied to the Pump port. The parametric amplifier 120 will generate an amplified output signal with the frequency $f_s$ of the input signal, as well as an idler signal (or idler tone) with a frequency $f_i$ (or angular frequency $\omega_i=2\pi f_i$), which is generated as a result of a non-linear amplification process. Moreover, depending on the type of parametric frequency mixing (e.g., three-wave mixing or four-wave mixing) that is implemented by the parametric amplifier 120, the resulting idler signal will have a frequency $f_i=f_s+f_p$ (for three-wave mixing) or $f_i=f_s+2f_p$ (for four-wave mixing). Moreover, the phase of the pump signal is imparted onto the idler signal (or idler tone) with the idler signal shifted in phase proportional to the frequency of the pump signal.

While FIG. 1C illustrates an exemplary embodiment in which the parametric amplifier 120 comprises one Pump port, depending on the specific implementation, a parametric amplifier may be operated using more than one pump tone such that the parametric amplifier 120 can have more than one Pump port. Moreover, the method by which the pump signal is injected or coupled into the parametric amplifier 120 will depend on the specific implementation, e.g., a separate circuit such as a diplexer, directional coupler, or a flux bias line for a SQUID. As explained in further detail below, the parametric amplifier 120 can be implemented using various circuit architectures including, but not limited to, a Josephson traveling-wave parametric amplifier (JTWPA) circuit, or a SQUID-based parametric amplifier, exemplary embodiments of which will be described in further detail below in conjunction with FIGS. 2, 3A, and 3B.

Figure 2:
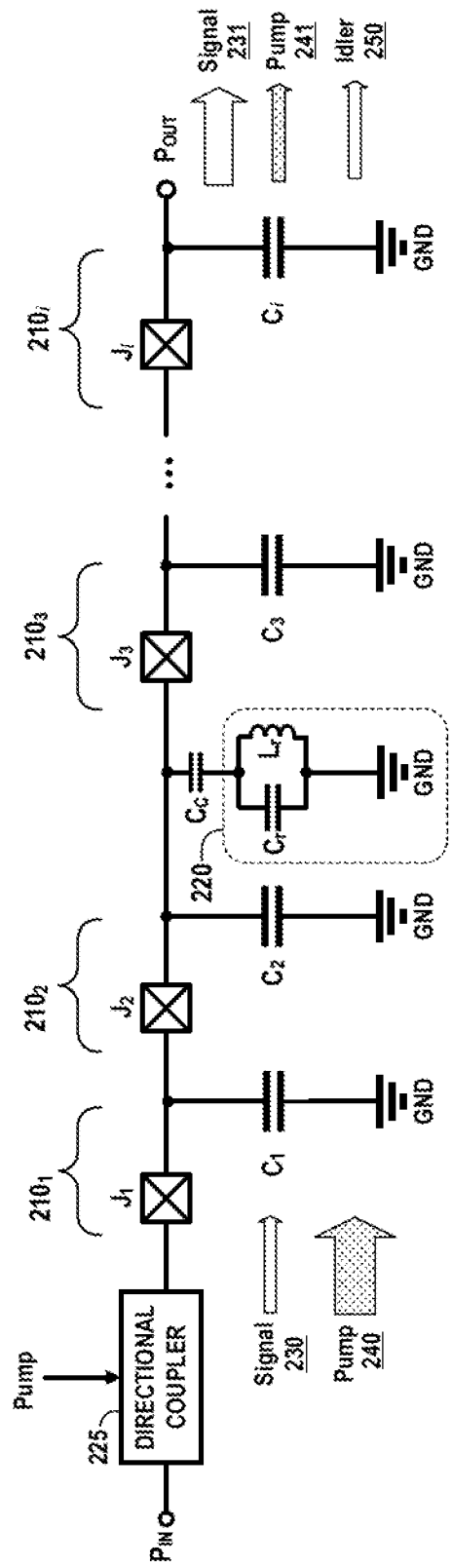
FIG. 2 schematically illustrates a Josephson junction traveling-wave parametric circuit which can be utilized to implement interferometric configurations of broadband isolators and directional quantum-limited amplifiers, according to an exemplary embodiment of the disclosure.

FIG. 2 schematically illustrates a Josephson junction traveling-wave parametric circuit which can be utilized to implement interferometric configurations of broadband isolators and directional quantum-limited amplifiers, according to an exemplary embodiment of the disclosure. In particular, FIG. 2 schematically illustrates a Josephson junction traveling-wave parametric circuit 200 which can be configured to operate as a Josephson traveling-wave parametric amplifier (JTWPA) circuit, or a Josephson traveling-wave frequency converter (JTWFC). The Josephson junction traveling-wave parametric circuit 200 comprises an input port $P_{IN}$, an output port $P_{OUT}$, and a non-linear transmission line comprising a series of unit cells $210_1$, $210_2$, $210_3$, ..., $210_i$ (collectively, unit cells 210). Each unit cell $210_1$, $210_2$, $210_3$, ..., $210_i$ of the non-linear transmission line comprises a respective Josephson junction $J_1$, $J_2$, $J_3$, ..., $J_i$ and a respective capacitor $C_1$, $C_2$, $C_3$, ..., $C_i$. The Josephson junctions $J_1$, $J_2$, $J_3$, ..., $J_i$ are connected in series between the input port $P_{IN}$ and the output port $P_{OUT}$. In each unit cell 210, the respective capacitor $C_1$, $C_2$, $C_3$, ..., $C_i$ provides a capacitive shunt to a ground GND node, and the respective Josephson junction $J_1$, $J_2$, $J_3$, ..., $J_i$ provides both inductance and nonlinearity.

In addition, the Josephson junction traveling-wave parametric circuit 200 comprises a dispersion element 220 (e.g., dispersion resonator) which is configured to add dispersion along the transmission line so that energy and momentum can be simultaneously conserved during an amplification or frequency conversion process. In some embodiments, as shown in FIG. 2, the dispersion element 220 comprises a microwave LC resonator circuit comprising a capacitor $C_r$ and inductor $L_r$ which are connected in parallel, and a coupling capacitor $C_c$ which couples the LC resonator to the non-linear transmission line of the Josephson junction traveling-wave parametric circuit 200. While FIG. 2 shows one dispersion element 220 for ease of illustration, the Josephson junction traveling-wave parametric circuit 200 comprises multiple instances of the dispersion element 220 disposed at various points along the non-linear transmission line. For example, in some embodiments, every $n^{th}$ unit cell (e.g., n=3) comprises an instance of the dispersion element 220. The dispersion resonators are configured to maintain phase matching to counteract the phase differences between the different modes that are propagating in the Josephson junction traveling-wave parametric circuit 200. Typically, the dispersion elements 220 comprising the LC resonators and associated coupling capacitors $C_c$ are designed to set a desired frequency range to obtain phase matching and counteract the dispersion along the transmission line of the Josephson junction traveling-wave parametric circuit 200.

FIG. 2 schematically illustrates an exemplary mode of operation of Josephson junction traveling-wave parametric circuit 200 when configured as a JTWPA. In particular, FIG. 2 schematically illustrates an input signal 230 and a pump signal 240 that are applied to the input port $P_{IN}$, and a plurality of output signals that are output from the output port Pour including an amplified output signal 231, an output pump signal 241, and an idler signal 250. The input signal 230 comprises a microwave signal having a signal frequency (denoted $f_s$). The pump signal 240 comprises a microwave signal with a pump frequency (denoted $f_p$), which provides power for amplifying the input signal 230 at the signal frequency $f_s$. In some embodiments, a directional coupler 225 is utilized to couple the input signal 230 and the pump signal 240 to the input port $P_{IN}$. The idler signal 250 is a microwave signal having an idler frequency (denoted $f_i$), which is generated as a result of the nonlinear amplification process. For example, as noted above, for a four-wave mixing process, the idler signal 250 has a frequency $f_i$, which is a function of the input signal frequency $f_s$ and the pump signal frequency $f_p$, as follows: $f_i=2\cdot f_p-f_s$.

When configured as a JTWPA, the Josephson junction traveling-wave parametric circuit 200 receives the input signal 230 and the pump signal 240, and amplifies the input signal 230 by taking power from the pump signal 240. For example, in the four-wave mixing process, two pump photons are converted into a new photon at the signal frequency $f_s$ and a new photon at the idler frequency $f_i$. This is schematically shown in FIG. 2, wherein the amplified output signal 231 is represented by an arrow which is thicker than an arrow which represents the input signal 230, and wherein the input pump signal 240 is represented by an arrow which is thicker than an arrow which represents the output pump signal 241.

The Josephson junction traveling-wave parametric circuit 200 can be configured to operate as a Josephson traveling-wave frequency converter circuit by changing certain parameters and utilizing a pump frequency that is selected to enable frequency conversion, e.g., convert an input signal frequency to an output idler frequency. For example, a Josephson traveling-wave frequency converter circuit can be configured to perform four-wave mixing and frequency up-conversion, where the frequency $f_s$ of the input pump signal (e.g., pump signal 240, FIG. 2) and the frequency $f_i$ of the idler signal (e.g., idler signal 250, FIG. 2) have the following relation: $f_i = 2 \cdot f_p + f_s$, which is slightly different from frequency relationship $f_i = 2 \cdot f_p - f_s$ for operation as a JTWPA circuit.

Figure 3A:
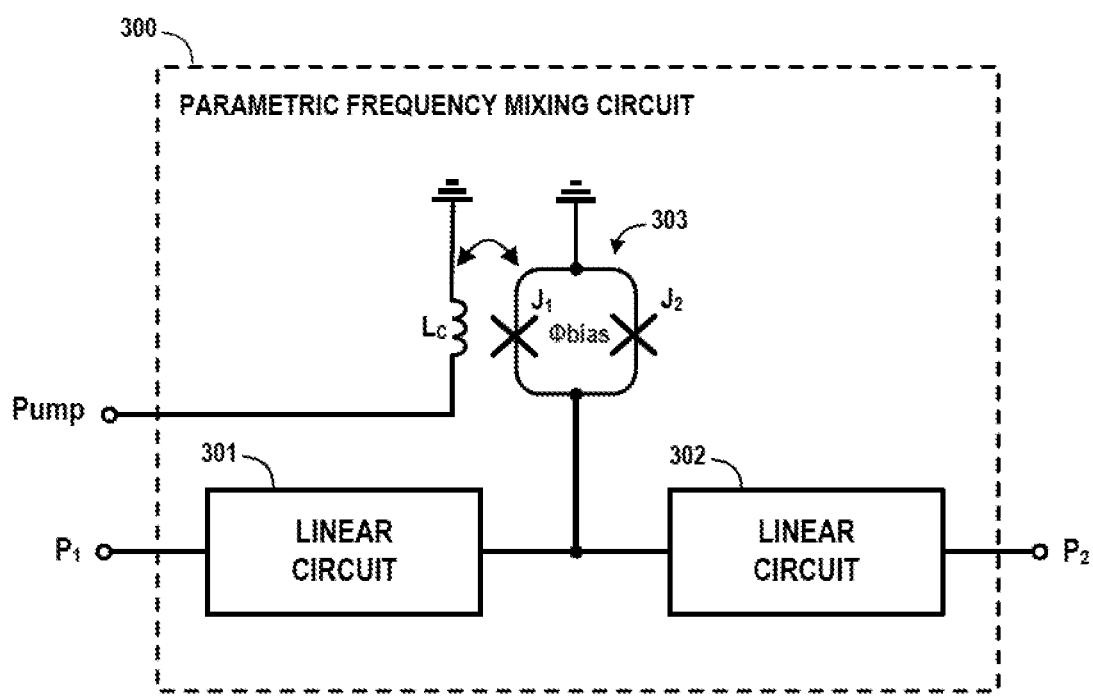
FIG. 3A schematically illustrates a two-port SQUID-based parametric frequency mixing circuit that can be utilized to implement superconducting parametric interferometer circuits, according to an exemplary embodiment of the disclosure.

FIG. 3A schematically illustrates a two-port SQUID-based parametric frequency mixing circuit that can be utilized to implement superconducting parametric interferometer circuits, according to an exemplary embodiment of the disclosure. In particular, FIG. 3A schematically illustrates a parametric frequency mixing circuit 300 which comprises a first port P1, a second port P2, a pump port Pump, a first linear circuit 301, a second linear circuit 302, a DC-SQUID 303, and coupling inductor $L_C$ disposed in proximity to the DC-SQUID 303. The DC-SQUID 303 comprises a superconducting loop which comprises two Josephson junctions including a first Josephson junction J1 and a second Josephson junction J2. In some embodiments, the linear circuits 301 and 302 comprise passive filter circuits, which collectively implement a bandpass filter.

The linear circuits 301 and 302 are filter networks that are parametrically-coupled via modulation of the DC-SQUID 303 by applying a pump signal to the Pump port to cause parametric frequency mixing and thereby implement parametric amplification or parametric frequency conversion, depending on the circuit configuration. A pump signal (e.g., a continuous pump signal frequency (with a DC offset for three-wave mixing) is applied to the Pump port and, in response, the coupling inductor $L_C$ (which is disposed adjacent and in proximity to the DC-SQUID 303) generates a magnetic flux bias $\Phi_{bias}$ that threads through the superconducting loop of the DC-SQUID 303, which, in turn, modulates the inductances of the Josephson junctions and thus enables parametric frequency mixing with an input signal applied to the first port P1, resulting in parametric amplification or parametric frequency conversion of the input signal, depending on the configuration of the parametric frequency mixing circuit 300.

Figure 3B:
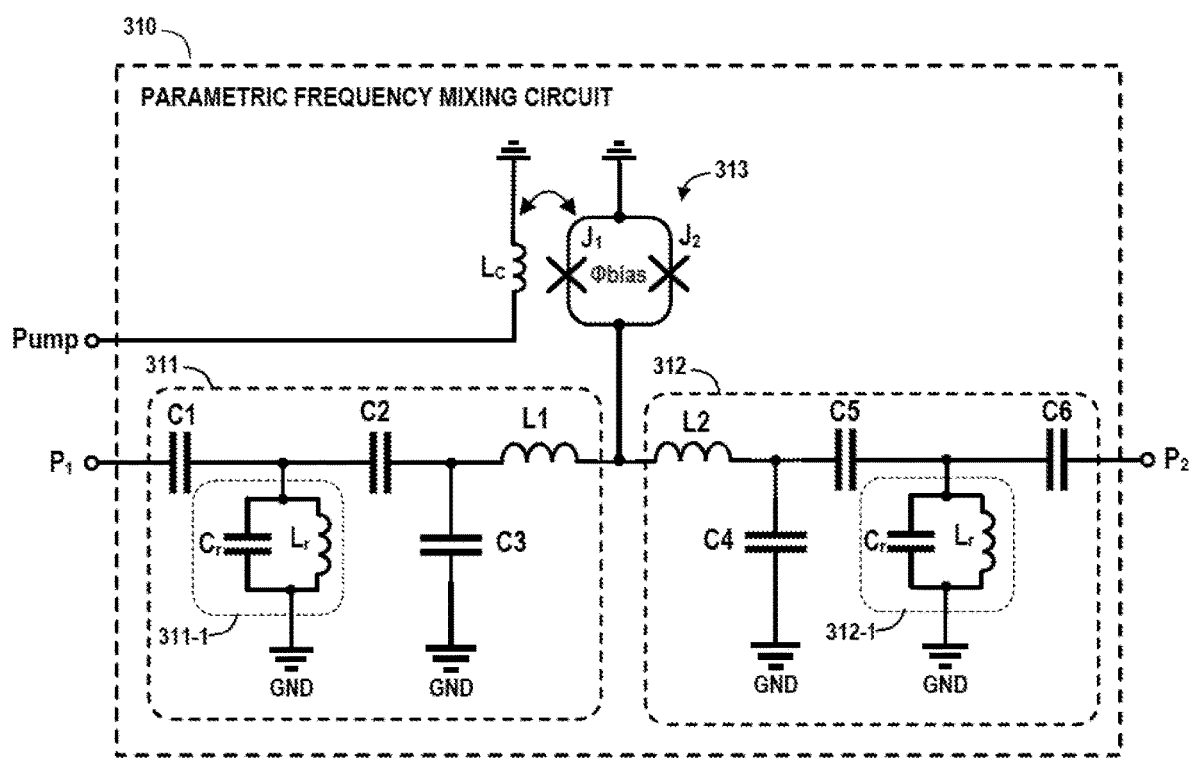
FIG. 3B schematically illustrates a two-port SQUID-based parametric frequency mixing circuit that can be utilized to implement superconducting parametric interferometer circuits, according to another exemplary embodiment of the disclosure.

FIG. 3B schematically illustrates a two-port SQUID-based parametric frequency mixing circuit that can be utilized to implement superconducting parametric interferometer circuits, according to another exemplary embodiment of the disclosure. In particular, FIG. 3B schematically illustrates a parametric frequency mixing circuit 310 which comprises a first port P1, a second port P2, a pump port Pump, a first passive filter circuit 311, a second passive filter circuit 312, a DC-SQUID 313, and coupling inductor $L_C$ disposed in proximity to the DC-SQUID 313. The first passive filter circuit 311 comprises an inductor L1, capacitors C1, C2, and C3, and an LC resonator 311-1. The second passive filter circuit 312 comprises an inductor L2, capacitors C4, C5, and C6, and an LC resonator 312-1. FIG. 3B illustrates an exemplary embodiment in which the first and second passive filter circuits 311 and 312 collectively implement a multipole immittance inverting bandpass filter in which the first and second passive filter circuits 311 and 312 are parametrically coupled via modulation of the DC-SQUID by the pump signal applied to the Pump port, as is readily understood by those of ordinary skill in the art.

Figure 4:
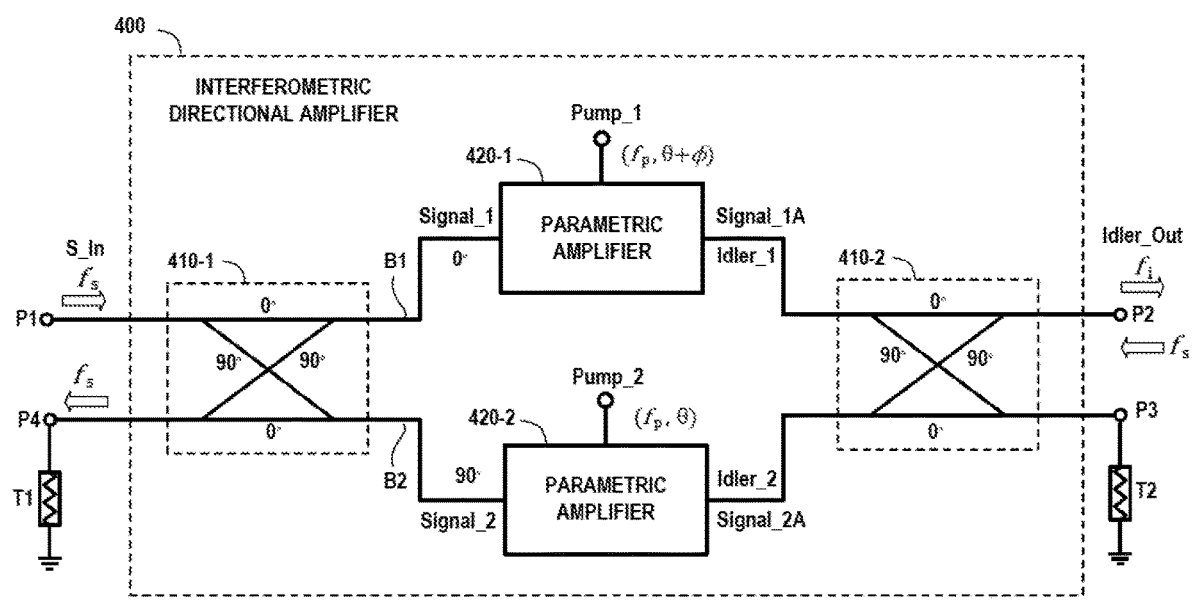
FIG. 4 schematically illustrates a superconducting parametric interferometer circuit that is configured to provide directional amplification, according to an exemplary embodiment of the disclosure.

In some embodiments, a directional amplifier circuit can be implemented using an interferometric configuration comprised of instances of the hybrid coupler 100 and the parametric amplifier 120. For example, FIG. 4 schematically illustrates a superconducting parametric interferometer circuit that is configured to provide directional amplification, according to an exemplary embodiment of the disclosure. In particular, FIG. 4 schematically illustrates an interferometric directional amplifier circuit 400 which comprises a first hybrid coupler 410-1, a second hybrid coupler 410-2, a first parametric amplifier 420-1, and a second parametric amplifier 420-2. In the exemplary embodiment of FIG. 4, the first hybrid coupler 410-1 and the second hybrid coupler 410-2 each comprise a 90-degree hybrid coupler. The first and second parametric amplifiers 420-1 and 420-2 are implemented using the same parametric amplifier circuit architecture and are nominally identical. The first and second parametric amplifiers 420-1 and 420-2 can be implemented using any suitable parametric amplifier architecture, such as those discussed herein.

The interferometric directional amplifier circuit 400 comprises a first port P1, a second port P2, a third port P3, and a fourth port P4. In an exemplary embodiment as shown in FIG. 4, the interferometric directional amplifier circuit 400 essentially operates as two-port circuit by utilizing the first port P1 as a signal input port, and utilizing the second port P2 as an output port, with the third port P3 and the fourth port P4 isolated by respective terminations T2 and T1 (e.g., 50 Ohm terminations). The first parametric amplifier 420-1 and the second parametric amplifier 420-2 are coupled in parallel between the first hybrid coupler 410-1 and the second hybrid coupler 410-2. In particular, the first parametric amplifier 420-1 is disposed in a first branch B1 (e.g., 0° branch) of the interferometric directional amplifier circuit 400, while the second parametric amplifier 420-2 is disposed in a second branch B2 (e.g., 90° branch) of the interferometric directional amplifier circuit 400, wherein the first and second branches B and B2 are coupled in parallel between the first hybrid coupler 410-1 and the second hybrid coupler 410-2.

As further schematically shown in FIG. 4, the first parametric amplifier 420-1 is driven by a first pump signal Pump_1, and the second parametric amplifier 420-2 is driven by a second pump signal Pump_2. In some embodiments, the first and second pump signals Pump_1 and Pump_2 have a same pump frequency $f_p$, and a phase offset of $\phi$. For example, in the exemplary embodiment of FIG. 4, the second pump signal Pump_2 comprises the pump frequency $f_p$ and a phase $\theta$, and the first pump signal Pump_1 comprises the same pump frequency $f_p$ and phase $\theta + \phi$, wherein $\phi$ denotes the phase offset (or phase difference) between the first and second pump signals Pump_1 and Pump_2. In an exemplary embodiment where the first and second parametric amplifiers 420-1 and 420-2 each implement 4-wave mixing, interferometric directional amplification is achieved when the phase difference $\phi$ between the first and second pump signals Pump_1 and Pump_2 is set to, e.g., $\phi = 0°$, or $\phi = 180°$. On the other hand, in an exemplary embodiment where the first and second parametric amplifiers 420-1 and 420-2 each implement 3-wave mixing, interferometric directional amplification is achieved when the phase difference $\phi$ between Pump_1 and Pump_2 is set to, e.g., $\phi = 0°$ (where Pump_1 and Pump_2 are in phase).

In an exemplary mode of operation, the interferometric directional amplifier circuit 400 of FIG. 4 is configured to (i)

receive an input signal S_In with frequency $f_s$ at the first (input) port P1, (ii) amplify the input signal S_In and generate idler signals by the first parametric amplifier 420-1 and the second parametric amplifier 420-2, (iii) generate an amplified idler signal (Idler_Out) with frequency $f_i$ at the second (output) port P2 by constructive interference of the idler signals, (iv) dissipate the amplified input signal via the termination T2 at the third (isolated) port P3. More specifically, the interferometric directional amplifier circuit 400 operates as follows.

The input signal S_In with frequency $f_s$ is input to the first (input) port P1, and the first hybrid coupler 410-1 splits the input signal S_In into a first signal Signal_1 and a second signal Signal_2, wherein Signal_1 and Signal_2 each have about 50% of the power of the input signal S_In, but a phase difference of 90°. The first signal Signal_1 (with a phase of 0°) is applied to the first branch B1 from a 0° leg of the first hybrid coupler 410-1, while the second signal Signal_2 (with a phase of 90°) is applied to the second branch B2 from a 90° leg of the first hybrid coupler 410-1.

The first signal Signal_1 is input to the first parametric amplifier 420-1, which generates and outputs a first idler signal, Idler_1 (as well an amplified signal Signal_1A). The second signal Signal_2 is input to the second parametric amplifier 420-2, which generates and outputs a second idler signal, Idler_2 (as well as an amplified signal Signal_2A). By virtue of the parametric amplification of the first and second parametric amplifiers 420-1 and 420-2, the phases of the first and second idlers Idler_1 and Idler_2 will depend on the phases of Signal_1 and Signal_2, respectively, as well as the phase offset between the first and second pump signals Pump_1 and Pump_2.

In particular, the phases of the first and second idlers Idler_1 and Idler_2 will depend at least in part on the conjugate of the first and second signals Signal_1 and Signal_2, respectively, whereby the phases of the first and second idlers Idler_1 and Idler_2 will correspond to the conjugate (negative) phases of the first and second signals Signal_1 and Signal_2, respectively. In particular, in the exemplary embodiment of FIG. 4, since Signal_1 has a phase of 0°, the first parametric amplifier 420-1 will impart the conjugate (negative) phase of 0° to the first idler signal Idler_1. On the other hand, since Signal_2 has a phase of 90°, the second parametric amplifier 420-1 will impart the conjunction (negative) phase of –90° to the second idler Idler_2.

Furthermore, the phase difference between the first and second idler signals Idler_1 and Idler_2 will depend at least in part on the phase difference $\phi$ between the first and second pump signals Pump_1 and Pump_2, and the type of frequency mixing that is implemented by the first and second parametric amplifiers 420-1 and 420-2. In particular, as noted above, for 3-wave mixing, a parametric amplifier will impart a phase shift to the idler signal which is proportional to 1× the phase of the pump signal, while for 4-wave mixing, a parametric amplifier will impart a phase shift to the idler signal which is proportional to 2× the phase of the pump signal.

In an exemplary embodiment of the interferometric directional amplifier circuit 400 of FIG. 4, assume that the first and second parametric amplifiers 420-1 and 420-2 implement 4-wave mixing, and that there is a phase difference of $\phi$=180° between the first and second pump signals Pump_1 and Pump_2. In this instance, the first idler Idler_1 with have a phase shift of 0° (i.e., no phase shift) imparted by the amplification of Signal_1 (since the conjugate (negative) phase of first signal Signal_1 is 0°), but will have a phase shift of $2\phi$=360° which is imparted by the phase offset $\phi$ of the first pump signal Pump_1. As a result, the first idler Idler_1, which is applied to the second hybrid coupler 410-2, will essentially have a phase of 0°.

Further, the second idler Idler_2 will have a phase of –90° which is imparted by the amplification of Signal_1, which is the conjugate (negative) phase of Signal_1 with the phase of 90°. In addition, the second pump signal Pump_2 will not effectively change the phase of the second idler Idler_2. As a result, the second idler Idler_2, which is applied to the second hybrid coupler 410-2, will have a phase shift of –90°.

The second hybrid coupler 410-2 combines the first and second idlers Idler_1 and Idler_2 at the second (output) port P2 via constructive interference. More specifically, the first idler Idler_1 (with a phase of 0°) will be transmitted to the second (output) port P2 via a 0° leg of the second hybrid coupler 410-2, such that the phase of the first idler Idler_1 is not changed and remains at 0°. The second idler Idler_2 (with a phase of –90°) will be transmitted to the second (output) port P2 via a 90° leg of the second hybrid coupler 410-2, wherein the phase of second idler Idler_2 is shifted +90°, which effectively cancels the –90° phase such that the second idler Idler_2 will have a phase of 0° at the second (output) port P2. At the second (output) port P2, the first and second idlers Idler_1 and Idler_2 will have essentially the same phase (e.g., phase of 0°) and therefore combine through constructive interference to generate Idler_Out at the second (output) port P2.

It is to be noted that at the third port P3 (which is isolated by the termination T2), the first and second idlers Idler_1 and Idler_2 will have a phase offset at or near 180°, which results in destructive interference of Idler_1 and Idler_2 at the third port P3. More specifically, the first idler Idler_1 (with a phase of 0°) is transmitted to the third port P3 via a 90° leg of the second hybrid coupler 410-2, such that the phase of Idler_1 is further shifted by 90°. Moreover, the second idler Idler_2 is transmitted to the third port P3 via a 0° leg of the second hybrid coupler 410-2, such that the –90° phase of Idler_2 is not shifted. As a result, at the third port P3, the first idler signal Idler_1 (phase of 90°) and the second idler signal Idler_2 (phase of –90°) have a phase offset at or near 180°, which results in destructive interference of the first and second idler signals Idler_1 and Idler_2 at the third port P3.

Furthermore, at the second (output) port P2, the amplified signal Signal_1A (which is output from the first parametric amplifier 420-1) and the amplified signal Signal_2A (which is output from the second parametric amplifier 420-2) will have a phase offset at or near 180°, which results in destructive interference of the amplified signals Signal_1A and Signal_2A at the second (output) port P2. More specifically, the amplified signal Signal_1A (with a phase of 0°) is transmitted to the second (output) port P2 via a 0° leg of the second hybrid coupler 410-2, such that phase of Signal_1A is not changed. On the other hand, the second amplified signal Signal_2A (with a phase of 90°) is transmitted to the second (output) port P2 via a 90° leg of the second hybrid coupler 410-2, such that Signal_2A has a phase of 180° at the second (output) port P2. As a result, at the third port P3, the first and second amplified signals Signal_1A and Signal_2A will have a phase mismatch at or near 180°, which results in destructive interference of Signal_1A and Signal_2A at the second (output) port P2. On the other hand, at the third (isolated) port P3, the first and second amplified signals Signal_1A and Signal_2A will each have phase of 90° and thereby constructively interfere to produce an amplified version of the input signal, which is terminated via the termination T2.

Furthermore, the interferometric directional amplifier provides isolation in the reverse direction (e.g., isolation in the transmission direction S12) when a signal of frequency $f_s$ is applied at the second (output) port P2. In particular, as schematically shown in FIG. 4, when a signal with frequency $f_s$ is applied to the second (output) port P2, the second hybrid coupler 410-2 equally divides the signal into two signals with a phase difference of 90° on the first and second branches B1 and B2. The first hybrid coupler 410-1 receives and equally divides each of the two signals from the first and second branches B1 and B2, and (i) combines the signals via constructive interference at the fourth (isolated) port P4 where the signal with frequency $f_s$ is dissipated by the termination T1, and (ii) cancels the signals via destructive interference at the first (input) port P1, thereby eliminating or significantly suppressing any signal power output from the first (input) port P1. In a similar manner, mismatch reflections at the input of the first and second parametric amplifiers 420-1 and 420-2 are terminated into the fourth (isolated) port P4, and cancelled via destructive interference at the first (input) port P1 due to a 180° phase mismatch between the reflected signals at the first (input) port P1.

It is to be noted that the interferometric directional amplifier circuit 400 of FIG. 4 operates in a similar manner as discussed above in an exemplary embodiment where the first and second parametric amplifiers 420-1 and 420-2 are configured to perform 4-wave mixing and are driven by first and second pump signals Pump_1 and Pump_2 with the same frequency and same phase (i.e., ϕ=0°). Moreover, the interferometric directional amplifier circuit 400 of FIG. 4 operates in a similar manner as discussed above in an exemplary embodiment where the first and second parametric amplifiers 420-1 and 420-2 are configured to perform 3-wave mixing and are driven by first and second pump signals Pump_1 and Pump_2 with the same frequency and same phase (i.e., ϕ=0°).

Figure 5:
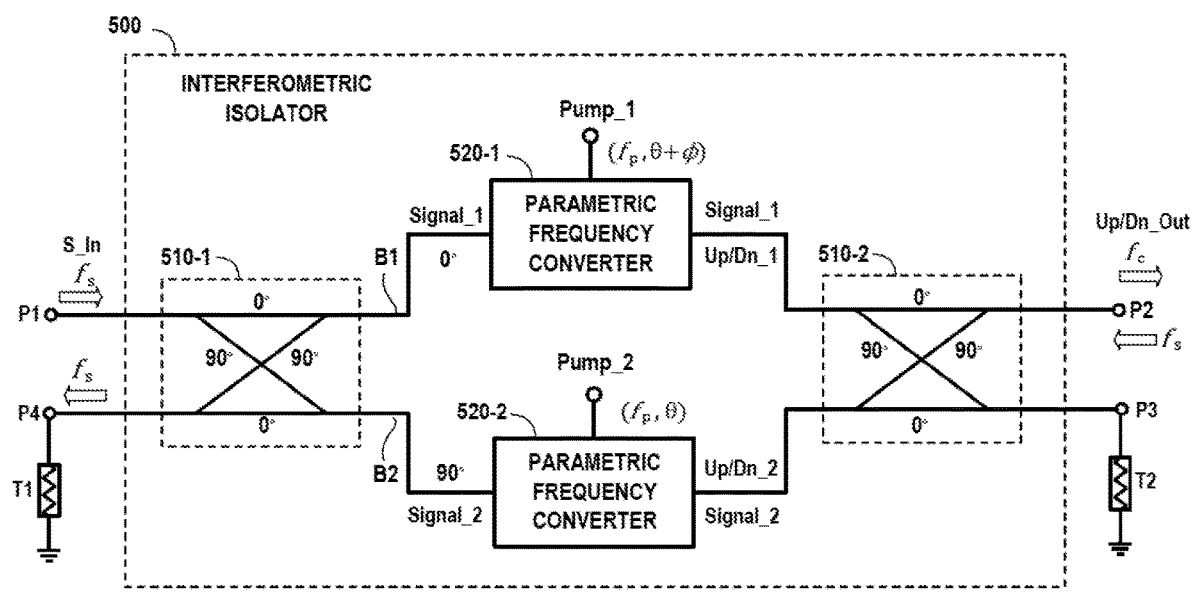
FIG. 5 schematically illustrates a superconducting parametric interferometer circuit that is configured to provide isolation, according to an exemplary embodiment of the disclosure.

Next, in some embodiments, a broadband isolator circuit can be implemented using an interferometric configuration comprised of instances of the hybrid coupler 100 and the parametric frequency converter 110. For example, FIG. 5 schematically illustrates a superconducting parametric interferometer circuit that is configured to provide isolation, according to an exemplary embodiment of the disclosure. In particular, FIG. 5 schematically illustrates an interferometric isolator circuit 500 which comprises a first hybrid coupler 510-1, a second hybrid coupler 510-2, a first parametric frequency converter 520-1, and a second parametric frequency converter 520-2. In the exemplary embodiment of FIG. 5, the first hybrid coupler 510-1 and the second hybrid coupler 510-2 each comprise a 90-degree hybrid coupler. The first and second parametric frequency converters 520-1 and 520-2 are implemented using the same parametric frequency converter circuit architecture and are nominally identical. In some embodiments, the first and second parametric frequency converters 520-1 and 520-2 can be implemented using any suitable parametric frequency architecture, such as those discussed herein.

The interferometric isolator circuit 500 comprises a first port P1, a second port P2, a third port P3, and a fourth port P4. In an exemplary embodiment as shown in FIG. 5, the interferometric isolator circuit 500 essentially operates as two-port circuit by utilizing the first port P1 as a signal input port, and utilizing the second port P2 as an output port, with the third port P3 and the fourth port P4 isolated by respective terminations T2 and T1 (e.g., 50 Ohm terminations). The first parametric frequency converter 520-1 and the second parametric frequency converter 520-2 are coupled in parallel between the first hybrid coupler 510-1 and the second hybrid coupler 510-2. In particular, the first parametric frequency converter 520-1 is disposed in a first branch B1 (e.g., 0-degree branch) of the interferometric isolator circuit 500, while the second parametric frequency converter 520-2 is disposed in a second branch B2 (e.g., 90° branch) of the interferometric isolator circuit 500, wherein the first and second branches B1 and B2 are coupled in parallel between the first hybrid coupler 510-1 and the second hybrid coupler 510-2.

As further schematically shown in FIG. 5, the first parametric frequency converter 520-1 is driven by a first pump signal Pump_1, and the second parametric frequency converter 520-2 is driven by a second pump signal Pump_2. In some embodiments, the first and second pump signals Pump_1 and Pump_2 have the same pump frequency $f_p$, as well as a phase offset ϕ (or phase difference) between them. For example, in the exemplary embodiment of FIG. 5, the second pump signal Pump_2 comprises the pump frequency $f_p$ and a phase θ, and the first pump signal Pump_1 comprises the same pump frequency $f_p$ and phase θ+ϕ, wherein ϕ denotes the phase offset (or phase difference) between the first and second pump signals Pump_1 and Pump_2. In an exemplary embodiment where the first and second parametric frequency converters 520-1 and 520-2 each implement 4-wave mixing, interferometric isolation is achieved when the phase difference ϕ between the first and second pump signals Pump_1 and Pump_2 is set to, e.g., ϕ=90°. On the other hand, in an exemplary embodiment where the first and second parametric frequency converters 520-1 and 520-2 each implement 3-wave mixing, interferometric isolation is achieved when the phase difference ϕ between the first and second pump signals Pump_1 and Pump_2 is set to, e.g., ϕ=180°.

In an exemplary mode of operation, the interferometric isolator circuit 500 of FIG. 5 is configured to (i) receive an input signal S_In with frequency $f_s$ at the first (input) port P1, (ii) either up-convert or down-convert the frequency $f_s$ of the input signal S_In and generate a respective up signal or down signal (denoted Up/Dn) by the first parametric frequency converter 520-1 and the second parametric frequency converter 520-2, (iii) generate a frequency-converted output signal (Up/Dn_Out) with frequency $f_c$ at the second (output) port P2 by constructive interference of the Up/Dn signals, (iv) dissipate the input signal S_In via the termination T2 at the third (isolated) port P3. More specifically, the interferometric isolator circuit 500 operates as follows.

The input signal S_In with frequency $f_s$ is input to the first (input) port P1, and the first hybrid coupler 510-1 splits the input signal S_In into a first signal Signal_1 and a second signal Signal_2, wherein Signal_1 and Signal_2 each have about 50% of the power of the input signal S_In, but a phase difference of 90°. The first signal Signal_1 (with a phase of 0°) is applied to the first branch B1 from a 0° leg of the first hybrid coupler 510-1, while the second signal Signal_2 (with a phase of 90°) is applied to the second branch B2 from a 90° leg of the first hybrid coupler 510-1.

The first signal Signal_1 is input to the first parametric frequency converter 520-1, which generates and outputs a first frequency-converted signal Up/Dn_1 with frequency $f_c$. The second signal Signal_2 is input to the second parametric frequency converter 520-2, which generates and outputs a second frequency-converted signal Up/Dn_2 with frequency $f_c$. It is to be noted that depending on the configuration of the first and second parametric frequency converters 520-1 and 520-1, after the frequency conversion, there may remain some residual frequency component at the Signal_1 and Signal_2 frequency $f_s$. In an exemplary embodiment where the first and second parametric frequency converters 520-1 and 520-2 are configured as frequency up-converters, the first and second frequency-converted signals Up/Dn_1 and Up/Dn_2 will be upconverted signals which have a frequency $f_c$ of either (i) $f_c=f_s+f_p$ (for three-wave mixing) or (ii) $f_c=f_s+2f_p$ (for four-wave mixing). On the other hand, in an exemplary embodiment where the first and second parametric frequency converters 520-1 and 520-2 are configured as frequency down-converters, the first and second frequency-converted signals Up/Dn_1 and Up/Dn_2 will be down-converted signals which have a frequency $f_c$ of either (i) $f_c=f_s-f_p$ (for three-wave mixing) or (ii) $f_c=f_s-2f_p$ (for four-wave mixing).

Moreover, the phases of the first and second frequency-converted signals Up/Dn_1 and Up/Dn_2 will depend on the phases the first and second input signals Signal_1 and Signal_2 respectively, as well as the phases of the second pump signals Pump_1 and Pump_2. More specifically, the first and second frequency-converted signals Up/Dn_1 and Up/Dn_2 will have phases that correspond to the phases of the respective first and second input signals Signal_1 and Signal_2. In addition, the first and second frequency-converted signals Up/Dn_1 and Up/Dn_2 will have an additional phase offset of either $\phi$ (for three-wave mixing) or $2\phi$ (for four-wave mixing), where $\phi$ represents a phase difference between the first and second pump signals Pump_1 and Pump_2 as discussed above.

By way of example, assume that in the exemplary embodiment of FIG. 5, the first and second parametric frequency converters 520-1 and 520-2 implement 4-wave mixing, and that there is a phase difference of $\phi=90°$ between the first and second pump signals Pump_1 and Pump_2. In this instance, the first frequency-converted signal Up/Dn_1 will have a phase shift of $2\phi=180°$, which is imparted by the phase offset $\phi$ of the first pump signal Pump_1 relative to the second pump signal Pump_2. The first frequency-converted signal Up/Dn_1 will have a phase of 0° based on the 0° phase of Signal_1, and the second frequency-converted signal Up/Dn_2 will have a phase of 90° based on the 90° phase of Signal_2. In addition, the first frequency-converted signal Up/Dn_1 will have a phase shift of phase of $2\phi=180°$ as a result of the first parametric frequency converter 520-1 imparting the phase of the first pump signal Pump_1 to the phase of the first frequency-converted signal Up/Dn_1.

In this instance, the first frequency-converted signal Up/Dn_1 with a phase of 180° is applied to the second hybrid coupler 510-2, while the second frequency-converted signal Up/Dn_2 with a phase of 90° is applied to the second hybrid coupler 510-2. The second hybrid coupler 510-2 combines the first and second frequency-converted signals Up/Dn_1 and Up/Dn_2 at the second (output) port P2 via constructive interference. More specifically, the first frequency-converted signal Up/Dn_1 (with a phase of 180°) is transmitted to the second (output) port P2 via a 0° leg of the second hybrid coupler 510-2, such that the phase of first frequency-converted signal Up/Dn_1 is not changed and remains at 180°. The second frequency-converted signal Up/Dn_2 (with an initial phase of 90°) is transmitted to the second (output) port P2 via a 90° leg of the second hybrid coupler 510-2, wherein the phase of Up/Dn_2 is further shifted +90°, such that the second frequency-converted signal Up/Dn_2 will have a phase of 180° at the second (output) port P2. At the second (output) port P2, the first and second idler signals Idler_1 and Idler_2 will have essentially the same phase (e.g., phase of 180°) and therefore combine through constructive interference to generate the frequency-converted output signal Up/Dn_Out at the second (output) port P2. In some embodiments, the frequency-converted output signal Up/Dn_Out has a unity gain with some minimal loss in power due to the Manley-Rowe energy relations of parametric devices that have non-linear reactance elements, as is known in the art. In this regard, the interferometric isolator circuit 500 of FIG. 5 is configured to operate as an isolator which passes a frequency-converted signal Up/Dn_Out, which corresponds to the input signal S_In, but with tones that are either up-converted or down-converted.

It is to be noted that at the third port P3 (which is isolated by the termination T2), the first and second frequency-converted signals Up/Dn_1 and Up/Dn_2 will have a phase offset at or near 180°, which results in destructive interference of Up/Dn_1 and Up/Dn_2 at the third port P3. More specifically, the first frequency-converted signal Up/Dn_1 (with an initial phase of) 180° is transmitted to the third port P3 via a 90° leg of the second hybrid coupler 510-2, such that the phase of the first frequency-converted signal Up/Dn_1 is further shifted by 90°, resulting in a phase of 180°+90°=270°. Moreover, the second frequency-converted signal Up/Dn_2 (with an initial phase of 90°) is transmitted to the third port P3 via a 0° leg of the second hybrid coupler 510-2, such that the 90° phase of the second frequency-converted signal Up/Dn_2 is not shifted. As a result, at the third port P3, the first frequency-converted signal Up/Dn_1 (phase of 270°) and the second frequency-converted signal Up/Dn_2 (phase of 90°) have a phase difference (270°−90°) of at or near 180°, which results in destructive interference of the first and second frequency-converted signals Up/Dn_1 and Up/Dn_2 at the third port P3.

Furthermore, at the second (output) port P2, the residual first signal Signal_1 (which is output from the first parametric frequency converter 520-1) and the residual second signal Signal_2 (which is output from the second parametric frequency converter 520-2) will have a phase offset at or near 180°, which results in destructive interference of the residual first and second signals Signal_1 and Signal_2 at the second (output) port P2. More specifically, the residual Signal_1 (with a phase of 0°) is transmitted to the second (output) port P2 via a 0° leg of the second hybrid coupler 510-2, such that phase of the residual Signal_1 is not changed. On the other hand, the residual Signal_2 (with a phase of 90°) is transmitted to the second (output) port P2 via a 90° leg of the second hybrid coupler 510-2, such that the residual Signal_2 has a phase of 180° at the second (output) port P2. As a result, at the third port P3, the residual signals Signal_1 and Signal_2 will have a phase mismatch at or near 180°, which results in destructive interference of the Snout residual signals Signal_1 and Signal_2 at the second (output) port P2. On the other hand, at the third (isolated) port P3, the residual signals Signal_1 and Signal_2 will each have phase of 90° and thereby constructively interfere to produce a non-amplified version of the input signal S_In, which is terminated via the termination T2.

Furthermore, the interferometric isolator circuit 500 provides isolation in the reverse direction (e.g., isolation in the transmission direction $S_{12}$) when a signal of frequency $f_s$ is applied at the second (output) port P2. In particular, as schematically shown in FIG. 5, when a signal with frequency $f_s$ is applied to the second (output) port P2, the second hybrid coupler 510-2 equally divides the signal into two signals with a phase difference of 90° on the first and second branches B1 and B2. The first hybrid coupler 510-1 receives and equally divides each of the two signals from the first and second branches B1 and B2, and (i) combines the signals via constructive interference at the fourth (isolated) port P4 where the signal with frequency $f_s$ is dissipated by the termination T1, and (ii) cancels the signals via destructive interference at the first (input) port P1, thereby eliminating or significantly suppressing any signal power output from the first (input) port P1. In a similar manner, mismatch reflections at the input of the first and second parametric frequency converters 520-1 and 520-2 are terminated into the fourth (isolated) port P4, and cancelled via destructive interference at the first (input) port P1 due to a 180° phase mismatch between the reflected signals at the first (input) port P1.

It is to be noted that the interferometric isolator circuit 500 of FIG. 5 operates in a similar manner as discussed above in an exemplary embodiment where the first and second parametric frequency converters 520-1 and 520-2 are configured to perform 3-wave mixing and are driven by first and second pump signals Pump_1 and Pump_2 with the same frequency and phase offset of $\phi=180°$. In this instance, the first frequency-converted signal Up/Dn_I will have a phase shift of $\phi=180°$, which is imparted by the phase offset $\phi$ of the first pump signal Pump_1 relative to the second pump signal Pump_2. As such, the first and second frequency-converted signals Up/Dn_1 and Up/Dn_2 will have the same phase and combine via constructive interference at the second (output) port P2, while have a phase difference of 180° and thus phase cancel each other via destructive interference at the third (isolated) port P3.

Figure 6:
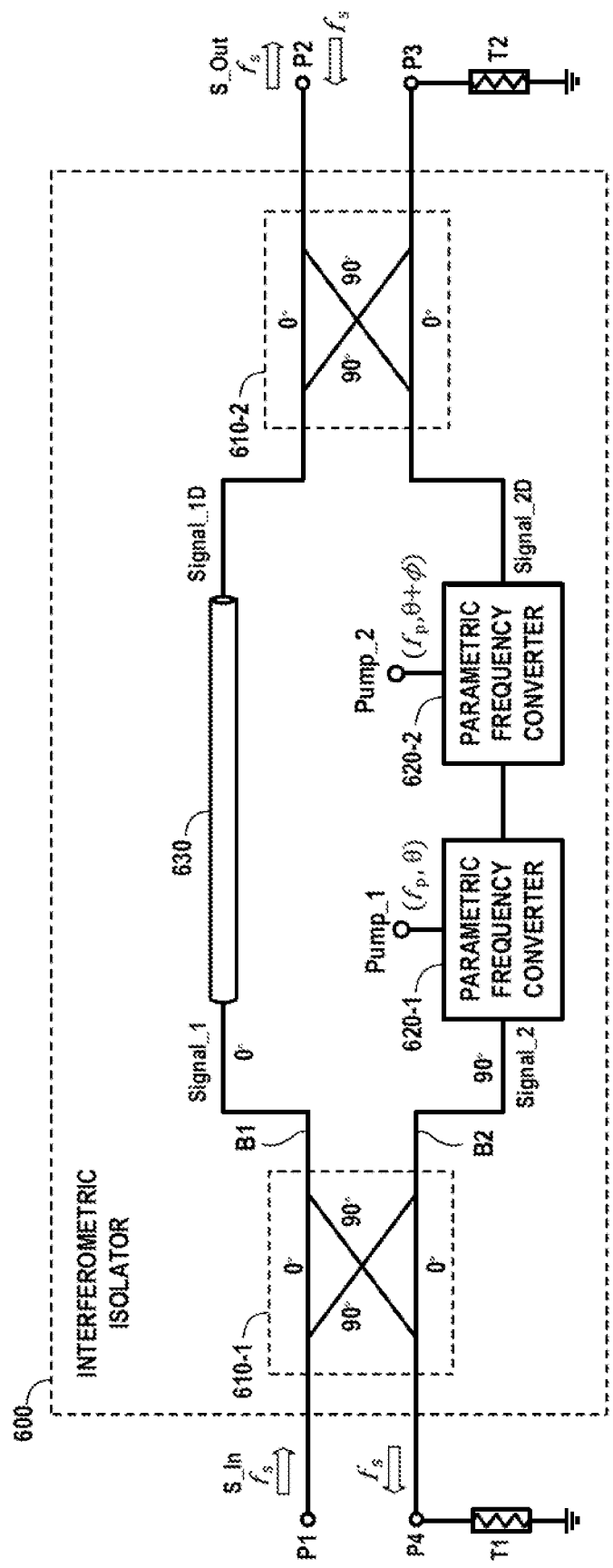
FIG. 6 schematically illustrates a superconducting parametric interferometer circuit that is configured to provide isolation, according to another exemplary embodiment of the disclosure.

FIG. 6 schematically illustrates a superconducting parametric interferometer circuit that is configured to provide isolation, according to another exemplary embodiment of the disclosure. In particular, FIG. 6 schematically illustrates an interferometric isolator circuit 600 which comprises a first hybrid coupler 610-1, a second hybrid coupler 610-2, a first parametric frequency converter 620-1, a second parametric frequency converter 620-2, and a delay line 630. In some embodiments, the first hybrid coupler 610-1 and the second hybrid coupler 610-2 each comprise a 90-degree hybrid coupler, although in other embodiments, the first and second hybrid couplers 610-1 and 610-2 can be implemented using, e.g., 180-degree hybrid couplers. In some embodiments, the first and second parametric frequency converters 620-1 and 620-2 can be implemented using any suitable parametric frequency architecture, such as those discussed herein.

As further shown in FIG. 6, the interferometric isolator circuit 600 comprises a first port P1, a second port P2, a third port P3, and a fourth port P4. In some embodiments, the interferometric isolator circuit 600 essentially operates as two-port circuit by utilizing the first port P1 as a signal input port, and utilizing the second port P2 as an output port, with the third port P3 and the fourth port P4 isolated by respective terminations T2 and T1 (e.g., 50 Ohm terminations). The interferometric isolator circuit 600 is configured to transmit an input signal S_In with frequency $f_s$ at the first (input) port P1 to an output signal S_Out with frequency $f_s$ at the second (output) port P2 (allow unity $S_{21}$ transmission) while suppressing or blocking the transmission of a signal with frequency $f_s$ from the second (output) port P2 to the first (input) port P1 (block $S_{12}$ transmission), thereby providing non-reciprocal signal transmission between the first and second ports P1 and P2.

As schematically illustrated in FIG. 6, the interferometric isolator circuit 600 comprises a cascade connection (or series connection) of the first and second parametric frequency converters 620-1 and 620-2, wherein an output of the first parametric frequency converter 620-1 is coupled to an input of the second parametric frequency converter 620-2. The delay line 630 is coupled in parallel with the cascaded first and second parametric frequency converters 620-1 and 620-2, between the first hybrid coupler 610-1 and the second hybrid coupler 610-2. In particular, the delay line 630 is disposed in a first branch B1 (e.g., 0° branch) of the interferometric isolator circuit 600, while the cascaded first and second parametric frequency converters 620-1 and 620-2 are disposed in a second branch B2 (e.g., 90° branch) of the interferometric isolator circuit 600, wherein the first and second branches B1 and B2 are coupled in parallel between the first hybrid coupler 610-1 and the second hybrid coupler 610-2.

In some embodiments, the first parametric frequency converter 620-1 comprises a parametric frequency up-converter, while the second parametric frequency converter 620-2 comprises a parametric frequency down-converter. In other embodiments, the first parametric frequency converter 620-1 comprises a parametric frequency down-converter, while the second parametric frequency converter 620-2 comprises a parametric frequency up-converter. The first and second parametric frequency converters 620-1 and 620-2 can be implemented using any suitable parametric frequency converter architecture, such as those discussed herein. In some embodiments, a filter can be disposed in the second branch B2 between the first and second parametric frequency converters 620-1 and 620-2 to filter spurious tones that are generated as a result of the parametric frequency conversion.

As further schematically shown in FIG. 6, the first parametric frequency converter 620-1 is driven by a first pump signal Pump_1, and the second parametric frequency converter 620-2 is driven by a second pump signal Pump_2. In some embodiments, the first and second pump signals Pump_1 and Pump_2 have a same pump frequency $f_p$, and a phase offset $\phi$ (or phase difference). For example, the first pump signal Pump_1 comprises the pump frequency $f_p$ and a phase $\theta$, and the second pump signal Pump_2 comprises the same pump frequency $f_p$ and phase $\theta+\phi$, wherein $\phi$ denotes the phase offset (or phase difference) between Pump_1 and Pump_2. The first and second parametric frequency converters 620-1 and 620-2 can implement 4-wave mixing or 3-wave mixing, wherein the phase offset $\phi$ is selected to achieve the proper phases to implement the interferometric isolation.

More specifically, the cascading of the first and second parametric frequency converters 620-1 and 620-2 to provide back-to-back parametric frequency up-conversion and frequency down-conversion allows the second branch B2 of the interferometric isolator circuit 600 to generate a signal which has the same frequency $f_s$ as the input signal S_In, and a phase that is controlled by the phases of the first and second pump signals Pump_1 and Pump_2 to ensure the proper phasing, in conjunction with phase of the signal output of the first branch B1 of the interferometric isolator circuit 600, to achieve constructive interference at the second (output) port P2 and thereby generate the output signal S_Out with the same frequency as the input signal S_In. The delay line 630 in the first branch B1 is configured to provide a phase balance between both branches B1 and B2 of the interferometric isolator circuit 600 by matching the slope of the phase of the cascaded parametric up/down converter over a given signal band of interest.

More specifically, in some embodiments, the interferometric isolator circuit 600 is configured to operate as follows. The input signal S_In with frequency $f_s$ is input to the first (input) port P1, and the first hybrid coupler 610-1 splits the input signal S_In into a first signal Signal_1 and a second signal Signal_2, wherein Signal_1 and Signal_2 each have about 50% of the power of the input signal S_In, but a phase difference of 90°. The first signal Signal_1 (with a phase of) 0° is applied to the first branch B1 from a 0° leg of the first hybrid coupler 610-1, while the second signal Signal_2 (with a phase of 90°) is applied to the second branch B2 from a 90° leg of the first hybrid coupler 610-1.

In the first branch B1, the first signal Signal_1 propagates along the delay line 630, and the delay line 630 outputs a signal Signal_1D which comprises group-delayed version of Signal_1. The delay line 630 can be implemented using suitable techniques known to those of ordinary skill in the art. For example, the delay line 630 can be a passive LC network that is implemented using a cascade of lumped inductors L and capacitors C, or a transmission line with a distributed inductance and capacitance per unit length. In all instances, the delay line 630 is designed to impart a group delay to the first signal Signal_1 by a specified increment of time to generate the group-delayed signal Signal_1D with the desired delay needed to implement interferometric isolation.

In the second branch B2, the second signal Signal_2 with the 90° phase is input to the first parametric frequency converter 620-1. Assuming that the first parametric frequency converter 620-1 is a frequency up-converter that implements 4-wave mixing and the first pump signal Pump_1 with $\phi=0°$, the first parametric frequency converter 620-1 will generate an up-converted frequency signal $f_{c1}$ with a frequency $f_{c1}=f_s+2f_p$ with a phase of 90° (since $2\phi=0$ the phase of the up-converted frequency signal $f_{c1}$ will be the 90° phase of Signal_2). Next, assuming that the second parametric frequency converter 620-2 is a frequency down-converter that implements 4-wave mixing, the second parametric frequency converter 620-1 will down-convert the up-converted frequency signal $f_{c1}$ to generate Signal_2D, which is a down-converted frequency signal with a frequency $f_{c2}=f_{c1}-2f_p=(f_s+2f_p)-2f_p=f_s$. The signal Signal_2D will have a phase of 90° based on the 90° phase of the up-converted frequency signal $f_{c1}$ (output from the first parametric frequency converter 620-1), in addition to a phase shift of phase of $2\phi=180°$ as a result of the second pump signal Pump_2 driving the second parametric frequency converter 620-2 with a phase offset $\phi=90°$, as discussed above.

As a result of the cascaded parametric frequency conversion in the second branch B2, the signal Signal_2D will have a frequency $f_s$ and a total phase shift of 90°+180°=270°. The signal Signal_2D is applied from the second branch B2 to the second hybrid coupler 610-2 and is transmitted to the second (output) port P2 via a 90° leg of the second hybrid coupler 610-2, wherein the phase of Signal_2D is further shifted +90°, such that Signal_2D will have a phase of 360° (or effectively 0°) at the second (output) port P2.

On the other hand, the signal Signal_1D is applied from the first branch B1 to the second hybrid coupler 610-2, and is transmitted to the second (output) port P2 via a 0° leg of the second hybrid coupler 610-2. Assuming the delay line 630 is configured to impart a constant group delay (which matches the slope vs frequency for the second branch B2) to the first signal Signal_1 to output the phase-delayed signal Signal_1D with a group delay of e.g., 360°, the signals Signal_1D and Signal_2D will have essentially the same phase (e.g., 360°) at the second (output) port P2 and therefore combine via constructive interference to generate the output signal S_Out with frequency $f_s$ at the second (output) port P2. It is to be noted that the term "group delay" refers to a time lag expired by different frequency components of the input signal as it passes through the delay line 630 (or filter 730 of FIG. 7). The group delay denotes how much the envelope of the signal is delayed by the delay line 630 (or filter 730 of FIG. 7). Unlike phase delay, which varies with frequency, group delay focuses on the overall time delay across the entire spectrum of frequency components of the signal.

It is to be noted that at the third port P3 (which is isolated by the termination T2), the signals Signal_1D and Signal_2D will have a phase offset at or near 180°, which results in destructive interference of the signals Signal_1D and Signal_2D at the third port P3. More specifically, the first signal Signal_1D (with an initial phase of 360°) is transmitted to the third port P3 via a 90° leg of the second hybrid coupler 610-2, such that the phase of Signal_1D is further shifted by 90°, resulting in a phase of 360°+90°=450°. Moreover, the second signal Signal_2D (with an initial phase of 270°) is transmitted to the third (isolated) port P3 via a 0° leg of the second hybrid coupler 610-2, such that the 270° phase of Signal_2D is not shifted. As a result, at the third (isolated) port P3, the first signal Signal_1D (phase of 450°) and the second signal Signal_2D (phase of 270°) have a phase difference (450°−270°) of at or near 180°, which results in destructive interference of the signals Signal_1D and Signal_2D at the third (isolated) port P3.

It is to be further noted that when a signal with frequency $f_s$ is applied to the second (output) port P2, the signal is dissipated in the fourth (isolated) port P4, in the same manner as discussed above for the exemplary embodiments of FIGS. 4 and 5. As such, the interferometric isolator circuit 600 provides non-reciprocal transmission and thus isolation between the first and second ports P1 and P2 when a signal is input to the second (output) port.

Figure 7:
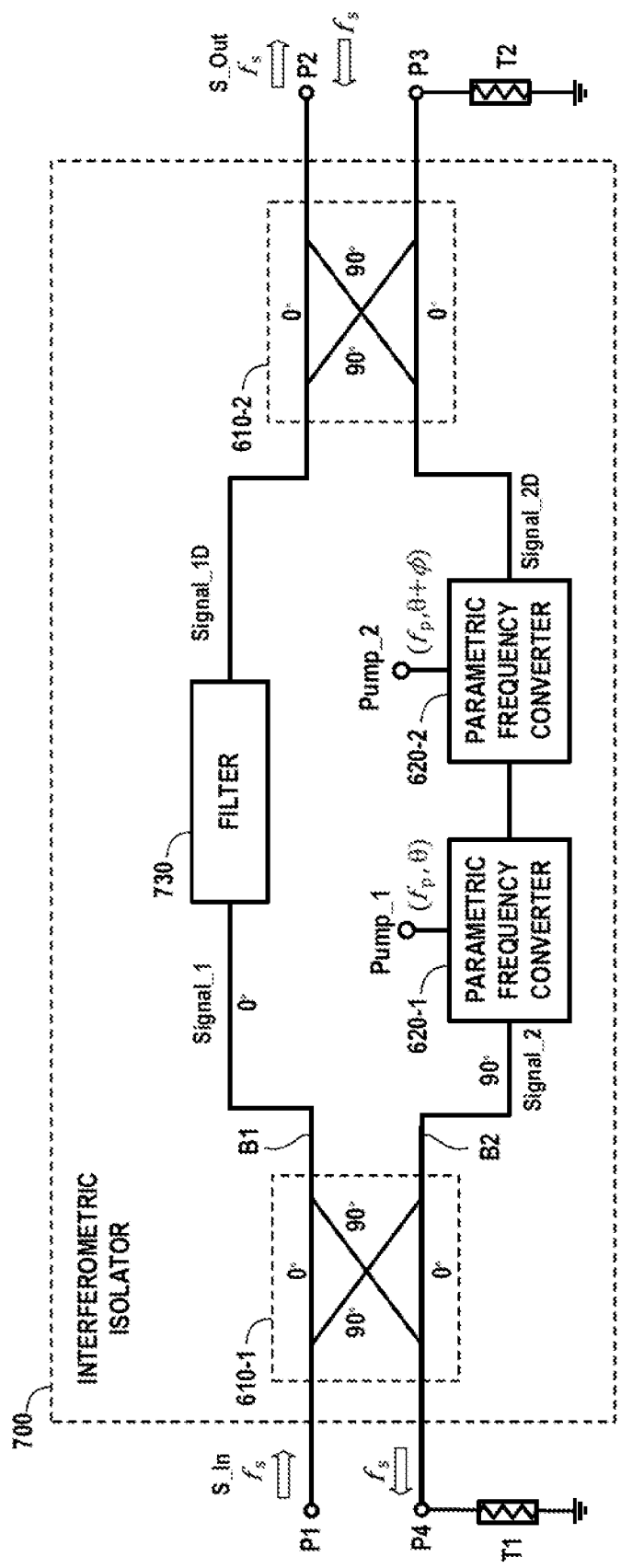
FIG. 7 schematically illustrates a superconducting parametric interferometer circuit that is configured to provide isolation, according to another exemplary embodiment of the disclosure.

FIG. 7 schematically illustrates a superconducting parametric interferometer circuit that is configured to provide isolation, according to another exemplary embodiment of the disclosure. In particular, FIG. 7 schematically illustrates an interferometric isolator circuit 700 which is similar in architecture and operation as the interferometric isolator circuit 600 of FIG. 6 as discussed above, except that the interferometric isolator circuit 700 implements a filter 730 in place of the delay line. The filter 730 can be a unity gain bandpass filter which comprises a bandwidth that is compatible with the intended frequency range of operation. The filter 730 can be configured to have, e.g., a group delay which provides the desired signal delay in the first branch B1 to generate the signal Signal_1D with the desired phase shift needed to implement interferometric isolation, as discussed above.

It is to be appreciated that the exemplary superconducting parametric interferometer circuits described herein are configured to provide broadband directional amplification and broadband isolation. In general, the bandwidth of a given superconducting parametric interferometer circuit is set by the bandwidth of the individual circuit components and thus, the overall bandwidth is limited by the circuit component having the smallest bandwidth. In the exemplary superconducting parametric interferometer circuits shown, for example, in FIGS. 4, 5, 6, and 7, the passive hybrid couplers can be designed to provide broadband response using well established microwave engineering techniques, and consequently, the passive hybrid couplers do not have to limit the bandwidth. In this regard, the bandwidth limiting components are typically the parametric circuit components, e.g., the parametric amplifiers and parametric frequency converters. However, the parametric amplifiers and parametric frequency converters can be designed to provide broadband operation over target frequency ranges of operation using state of the art techniques known to those of ordinary skill in the art.

In the exemplary configuration of FIG. 4, the interferometric directional amplifier circuit 400 can be implemented as a quantum-limited amplifier for various applications. Indeed, the noise that is added by a given parametric amplifier is assumed to be quantum-limited in the best case as has been demonstrated using state-of-the art superconducting parametric amplifiers. When used in the configuration shown in FIG. 4, the noise added can be shown to still be quantum limited at the second (output) port P2 when amplifying. While each of the first and second parametric amplifiers 420-1 and 420-2 in the first and second branches B1 and B2 adds noise as a result of the amplification, such noise is split between the second and third ports P2 and P2. As such, the overall interferometric directional amplifier circuit 400 is still quantum limited. In this regard, the exemplary interferometric directional amplifier circuit 400 can be implemented as a quantum-limited amplifier in a qubit readout chain.

It is to be further appreciated that the exemplary interferometric isolator circuits 500, 600, and 700 of FIGS. 5, 6 and 7, can be utilized as isolators in qubit readout chains of a superconducting quantum system. Depending on the given configuration of the interferometric isolator circuit used, the interferometric isolator circuit can be implemented in place of a passive ferrite-based isolator in a qubit readout chain. In instances where the interferometric isolator 500 of FIG. 5 is utilized in a qubit readout chain for isolation, since a qubit readout signal is converted to a different frequency (e.g., idler frequency) by virtue of the parametric frequency converters, the downstream components (e.g., amplifiers, filters, etc.) will be configured to process the frequency converted signal. In addition, to combine an interferometric isolator circuit with other circuits used in the readout chain, additional filtering can be implemented to effectively cascade the interferometric isolator circuit device with a downstream component.

It is to be noted that the exemplary superconducting parametric interferometer circuits described herein which are implemented using Josephson junction traveling-wave parametric circuits (e.g., JTWPAs), can be fabricated using a basic tri-layer process. The passive microwave components of the hybrid couplers can be realized in the same tri-layer process, or in a separate microwave monolithic integrated circuit (MMIC) process, or as discrete components. In the most compact implementation of a given superconducting parametric interferometer circuit, the entire circuit can be fabricated on a single chip. Separately, a given superconducting parametric interferometer circuit could be fabricated as a multi-chip module or also as a discrete component on a printed circuit board, wherein the hybrid couplers are fabricated separately "off chip" from the Josephson junction traveling-wave parametric circuits that are fabricated "on chip."

The exemplary superconducting parametric interferometer circuits shown in FIGS. 4, 5, 6, and 7 schematically illustrate the use of at least two pump signals for operation. As noted above, the pump signals have the same frequency, but can have different phases, depending on the given circuit configuration. In this regard, in some embodiments, a given superconducting parametric interferometer circuit can be operated using a common pump drive, while using a local static phase offset to generate the phase difference, thereby simplifying the pump feed network. Indeed, a given superconducting parametric interferometer circuit can be operated with two pump signals by using a common RF signal generator and one RF pump I/O line to extend through a cryostat to the given superconducting parametric interferometer circuit to feed a single RF pump signal which is split locally into two pump signals with the same frequency and desired phase offset to drive the parametric amplifiers or frequency converters of the given superconducting parametric interferometer circuit.

Moreover, it is to be noted that exemplary superconducting parametric interferometer circuits as shown in FIGS. 4, 5, 6, and 7 can be cascaded with filters, diplexers and/or other passive microwave circuits that are configured to remove unwanted frequency components that can adversely affect downstream components. For example, filters, diplexers, and/or other passive microwave circuits can be utilized to remove pump tones, harmonics of pump tones, and/or sideband frequency components (e.g., intermodulation components) that are generated and passed through (or leaked through due to non-idealities) to due parametric frequency mixing operations performed by the components of the superconducting parametric interferometer circuits, and thereby suppress the power of pump tones, harmonics of pump tones, and/or sideband frequency components to prevent transmission of such unwanted frequency component to downstream circuitry.

Figure 8A:
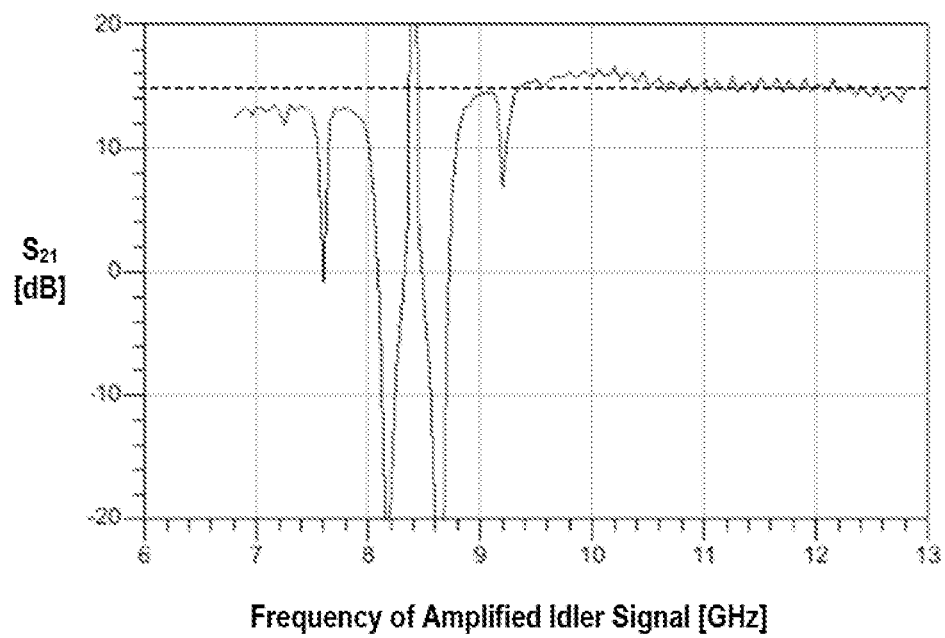
FIGS. 8A and 8B illustrate simulated scattering parameter waveforms of a superconducting parametric interferometer circuit that is configured to provide directional amplification, according to an exemplary embodiment of the disclosure.
Figure 8B:
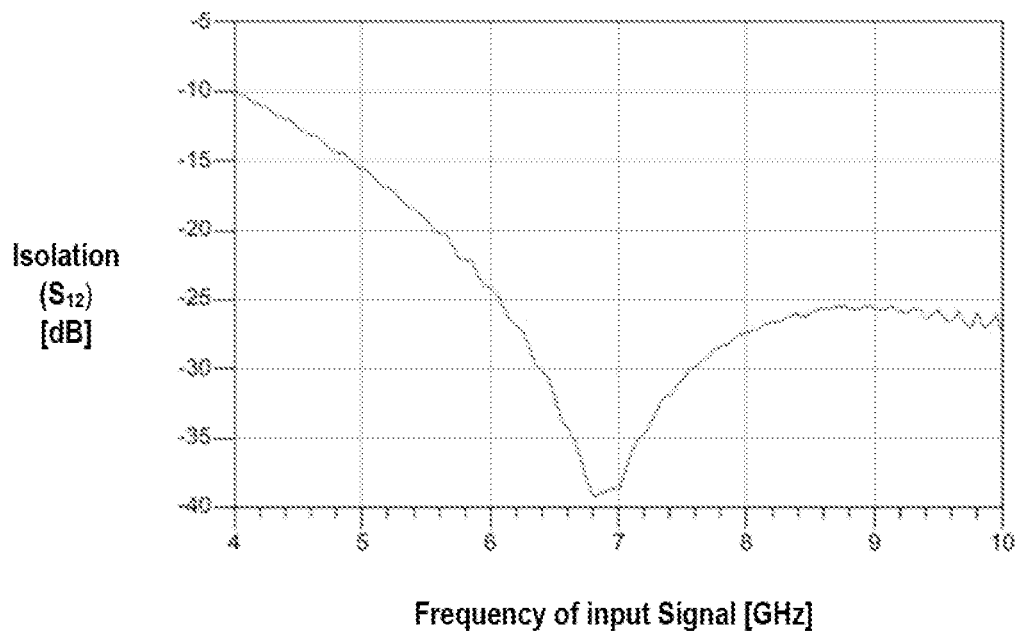

FIGS. 8A and 8B illustrate simulated scattering parameter waveforms of a superconducting parametric interferometer circuit that is configured to provide directional amplification, according to an exemplary embodiment of the disclosure. In particular, FIGS. 8A and 8B illustrate simulated scattering parameter waveforms for a simulated interferometric directional amplifier circuit having a circuit architecture based on the exemplary interferometric directional amplifier circuit 400 of FIG. 4 where the first and second parametric amplifiers 420-1 and 420-2 are implemented using JTWPAs. FIG. 8A illustrates a simulated $S_{21}$ waveform 800 in terms of power in dB (y-axis) as a function of frequency in GHz (x-axis), and FIG. 8B. illustrates a simulated $S_{12}$ waveform 810 in terms of power in dB (y-axis) as a function of frequency in GHz (x-axis).

The simulated $S_{21}$ waveform 800 in FIG. 8A is based on an input signal S_In (applied to the first (input) port P1) having a frequency from 4.0 GHz to 10.0 GHZ, and an amplified idler signal Idler_Out (at the second (output) port P2) with a frequency from 6.8 GHz to 12.8 GHz, which results from driving the first and second parametric amplifiers 420-1 and 420-2 with first and second pump signals Pump_1 and Pump_2 with a pump frequency of 8.4 GHz and phase offset of $\phi=180°$. The simulated $S_{21}$ waveform 800 of FIG. 8A illustrates that the interferometric directional amplifier circuit has a peak gain (e.g., better than about 15 dB) for the amplified idler signal Idler_Out within the range from 9.5 GHz to 12.8 GHZ, wherein the gain is relatively stable.

The simulated $S_{12}$ waveform 810 of FIG. 8B illustrates the isolation provided by the interferometric directional amplifier circuit in response to the input signal S_In having the frequency from 4.0 GHz to 10.0 GHz being applied to the second (output) port P2. FIG. 8B illustrates that the power transmission ($S_{12}$) of the input signal S_In from the second port P2 to the first port P1 is highly suppressed, e.g., better than 20 dB from 5.6 GHz to 10 GHz. As noted above, the input signal S_In applied to the second (output) port P2 is essentially dissipated in the fourth (isolated) port P4, thereby providing high isolation in the opposite direction from the second (output) port P2 to the first (input) port P1.

Figure 9A:
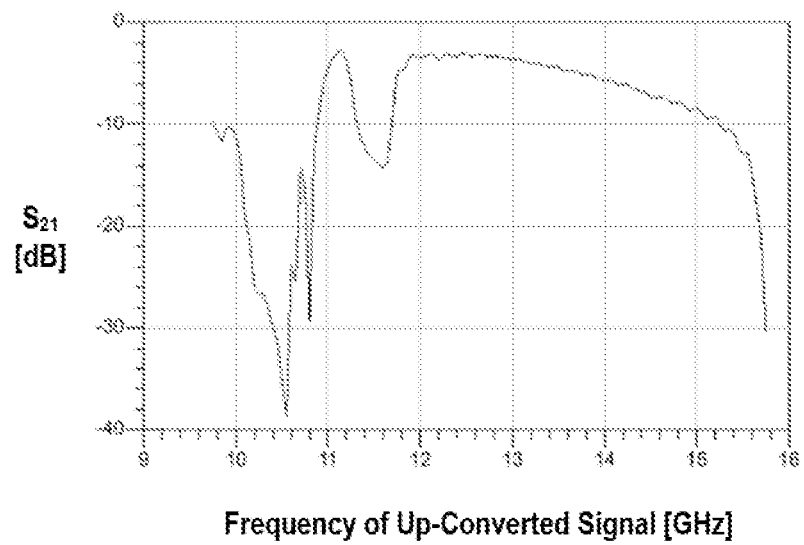
FIGS. 9A and 9B illustrate simulated scattering parameter waveforms of a superconducting parametric interferometer circuit that is configured to provide isolation, according to an exemplary embodiment of the disclosure.
Figure 9B:
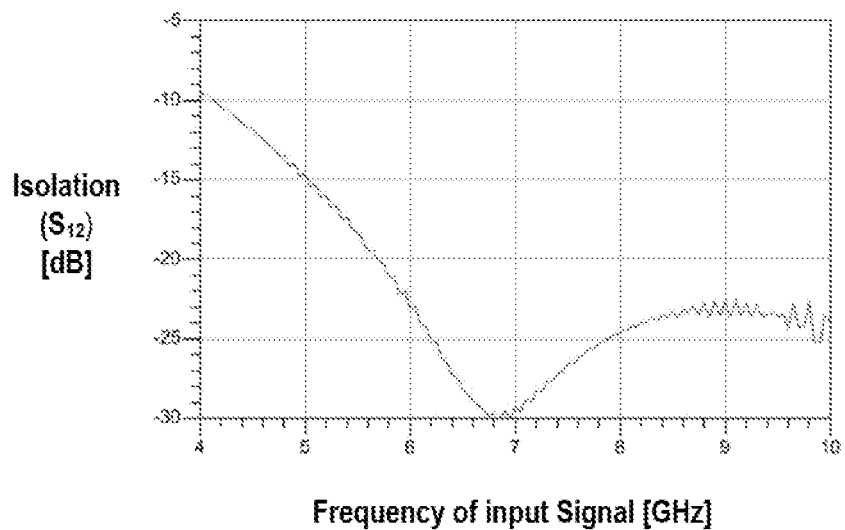

Next, FIGS. 9A and 9B illustrate simulated scattering parameter waveforms of a superconducting parametric interferometer circuit that is configured to provide isolation, according to an exemplary embodiment of the disclosure. In particular, FIGS. 9A and 9B illustrate simulated scattering parameter waveforms for a simulated interferometric isolator circuit having a circuit architecture based on the exemplary interferometric isolator circuit 500 of FIG. 5 where the first and second parametric frequency converters 520-1 and 520-2 are implemented using JTWFCs configured to provide frequency up-conversion. FIG. 9A illustrates a simulated $S_{21}$ waveform 900 in terms of power in dB (y-axis) as a function of frequency in GHz (x-axis), and FIG. 9B. illustrates a simulated $S_{12}$ waveform 910 in terms of power in dB (y-axis) as a function of frequency in GHz (x-axis).

The simulated $S_{21}$ waveform 900 in FIG. 9A is based on an input signal S_In having a frequency from 4.0 GHz to 10.0 GHZ (which is applied to the first (input) port P1), and an upconverted output signal having a frequency from 9.75 GHz to 15.75 GHZ (which is output from the second (output) port P2), as a result of driving the first and second parametric frequency converters 520-1 and 520-2 with first and second pump signals Pump_1 and Pump_2 having a pump frequency of 2.75 GHz and a phase offset of $\phi=90°$. The simulated $S_{21}$ waveform 900 of FIG. 9A illustrates that the interferometric isolation circuit provides near unity gain for the upconverted output signal within the range from 12.0 GHz to 14.0 GHZ.

The simulated $S_{12}$ waveform 910 of FIG. 9B illustrates the isolation provided by the interferometric isolator circuit in response to the input signal S_In having the frequency from 4.0 GHz to 10.0 GHz being applied to the second (output) port P2. FIG. 9B illustrates that the power transmission ($S_{12}$) of the input signal S_In from the second (output) port P2 to the first (input) port P1 is highly suppressed, e.g., better than 20 dB from 5.5 GHz to 10 GHz. As noted above, the input signal S_In applied to the second (output) port P2 is essentially dissipated in the fourth (isolated) port P4, thereby providing high isolation in the opposite direction from the second (output) port P2 to the first (input) port P1.

Figure 10:
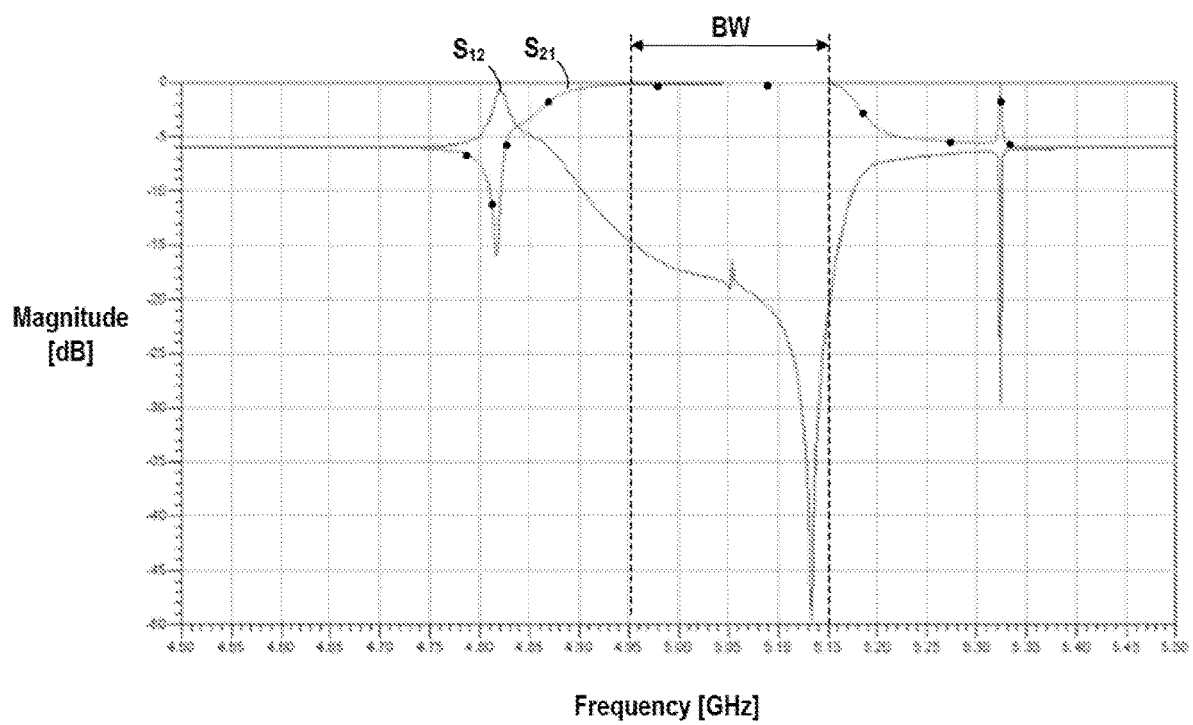
FIG. 10 illustrates simulated scattering parameter waveforms of a superconducting parametric interferometer circuit that is configured to provide isolation, according to another exemplary embodiment of the disclosure.

Next, FIG. 10 illustrates simulated scattering parameter waveforms 1000 of a superconducting parametric interferometer circuit that is configured to provide isolation, according to another exemplary embodiment of the disclosure. In particular, FIG. 10 illustrates simulated scattering parameter waveforms $S_{21}$ and $S_{12}$ in terms of power in dB (y-axis) as a function of frequency in GHZ (x-axis), for a simulated interferometric isolator circuit having a circuit architecture based on the exemplary interferometric isolator circuit 600 of FIG. 6 having the delay line 630 and where the first and second parametric frequency converters 620-1 and 620-2 comprise a frequency up-converter and frequency down-converter, which are implemented using SQUID-based parametric frequency converters (e.g., based on the architecture shown in FIG. 3B).

More specifically, FIG. 10 illustrates a simulated $S_{21}$ waveform of the transmitted signal power at the second (output) port P2 which is obtained based on applying an input signal S_In having a frequency from 4.5 GHz to 5.5 GHz to the first (input) port P1, while driving the first and second parametric frequency converters 620-1 and 620-2 with first and second pump signals Pump_1 and Pump_2 having the same pump frequency and a phase offset of $\phi=270°$. The simulated $S_{21}$ waveform illustrates that the interferometric isolation circuit provides unity gain (near 0 dB) for the transmission of the input signal S_In from the first (input) port P1 to the second (output) port P2 over a bandwidth BW from about 4.95 GHz to about 5.15 GHz of the input signal S_In. In this instance, the bandwidth BW is set by the bandwidth of the SQUID-based parametric frequency converters.

In addition, FIG. 10 illustrates a simulated $S_{12}$ waveform of the signal power output at the first (input) port P1 which is obtained based on applying the input signal S_In having the frequency from 4.5 GHz to 5.5 GHz to the second (output) port P2. The simulated $S_{12}$ illustrates an isolation of about 15 dB or better which is provided by the interferometric isolator circuit over the bandwidth BW from about 4.95 GHz to about 5.15 GHz of the input signal S_In applied to the second (output) port P2. As noted above, the input signal S_In applied to the second (output) port P2 is essentially dissipated in the fourth (isolated) port P4, thereby providing high isolation in the opposite direction from the second (output) port P2 to the first (input) port P1.

Figure 11:
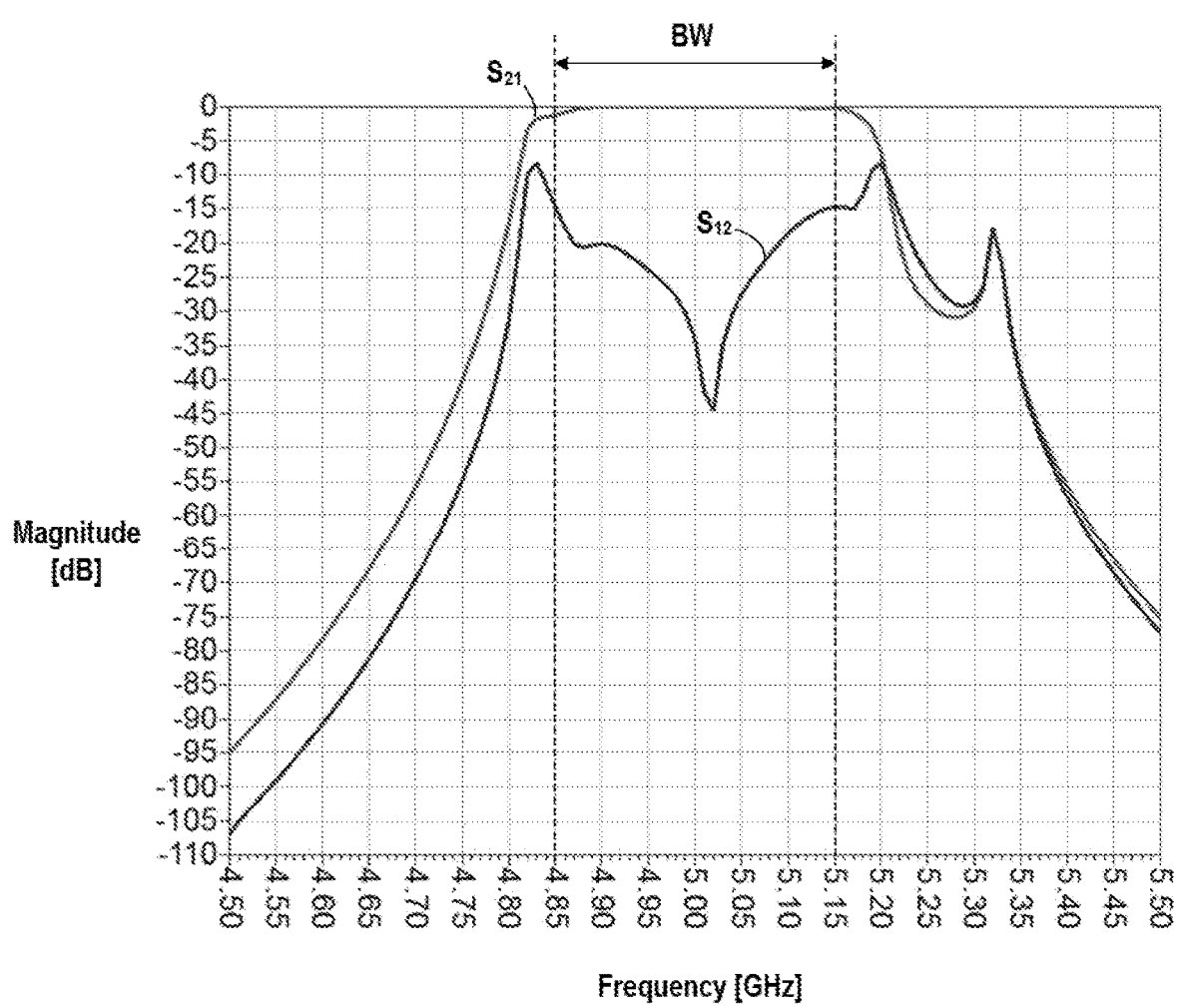
FIG. 11 illustrates simulated scattering parameter waveforms of a superconducting parametric interferometer circuit that is configured to provide isolation, according to another exemplary embodiment of the disclosure.

Next, FIG. 11 illustrates simulated scattering parameter waveforms 1100 of a superconducting parametric interferometer circuit that is configured to provide isolation, according to another exemplary embodiment of the disclosure. In particular, FIG. 11 illustrates simulated scattering parameter waveforms $S_{21}$ and $S_{12}$ in terms of power in dB (y-axis) as a function of frequency in GHz (x-axis), for a simulated interferometric isolator circuit having a circuit architecture based on the exemplary interferometric isolator circuit 700 of FIG. 7 having the filter 730, and where the first and second parametric frequency converters 620-1 and 620-2 comprise a frequency up-converter and frequency down-converter, which are implemented using SQUID-based parametric frequency converters (e.g., based on the architecture shown in FIG. 3B).

More specifically, FIG. 11 illustrates a simulated $S_{21}$ waveform of the transmitted signal power at the second (output) port P2 which is obtained based on applying an input signal S_In having a frequency from 4.5 GHZ to 5.5 GHz to the first (input) port P1, while driving the first and second parametric frequency converters 620-1 and 620-2 with first and second pump signals Pump_1 and Pump_2 having the same pump frequency and a phase offset of $\phi=270°$. The simulated $S_{21}$ waveform illustrates that the interferometric isolation circuit provides near unity gain (e.g., near 0 dB) for the transmission of the input signal S_In from the first (input) port P1 to the second (output) port P2 over a bandwidth BW from about 4.85 GHz to about 5.15 GHz of the input signal S_In.

In addition, FIG. 11 illustrates a simulated $S_{12}$ waveform of the signal power output at the first (input) port P1 which is obtained based on applying the input signal S_In having the frequency from 4.5 GHz to 5.5 GHz to the second (output) port P2. The simulated $S_{12}$ illustrates an isolation of about 15 dB or better which is provided by the interferometric isolator circuit over the bandwidth BW from about 4.85 GHz to about 5.15 GHz of the input signal S_In applied to the second (output) port P2. As noted above, the input signal S_In applied to the second (output) port P2 is essentially dissipated in the fourth (isolated) port P4, thereby providing high isolation in the opposite direction from the second (output) port P2 to the first (input) port P1.

Figure 12:
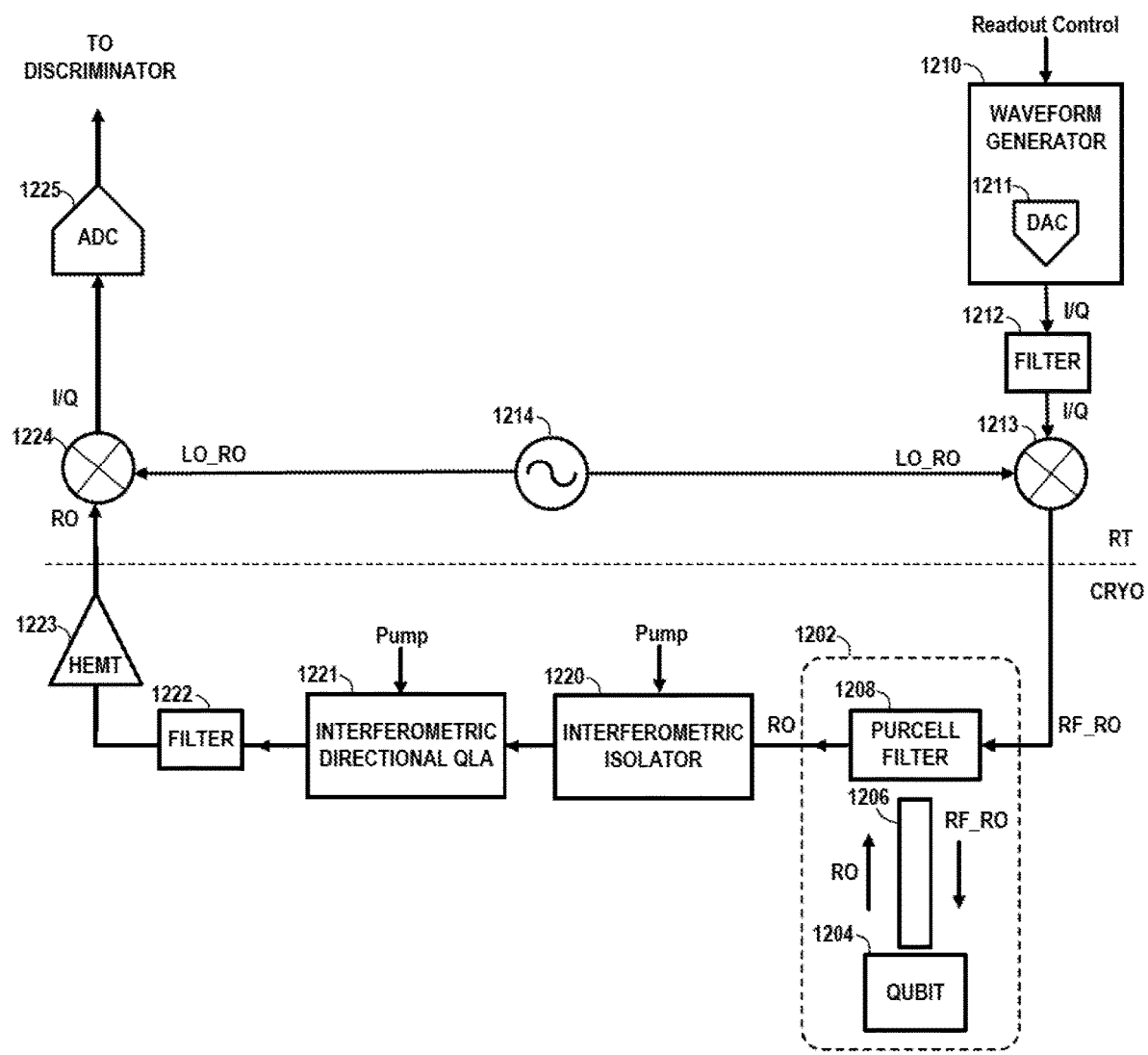
FIG. 12 schematically illustrates readout circuitry of a quantum processing system, which can implement superconducting parametric interferometer circuits in qubit readout signal paths to provide directional amplification and isolation, according to an exemplary embodiment of the disclosure.

FIG. 12 schematically illustrates readout circuitry of a quantum processing system, which can implement superconducting parametric interferometer circuits in qubit readout signal paths to provide directional amplification and isolation, according to an exemplary embodiment of the disclosure. More specifically, FIG. 12 schematically illustrates qubit readout circuitry 1200 of a quantum computing system which is configured to readout a quantum state of at least one superconducting qubit. For example, the qubit readout circuitry 1200 comprises a qubit-resonator device 1202 comprising a superconducting qubit 1204, a readout resonator 1206, and an optional Purcell filter 1208, which is configured to enable a dispersive qubit readout operation.

The qubit readout circuitry 1200 further comprises control circuitry that is configured to generate an RF readout control signal (RF_RO) to readout the state of the superconducting qubit 1204 using a dispersive readout scheme which enables a quantum non-demolition measurement of the state of the superconducting qubit 1204 to preserve the state of the superconducting qubit 1204. For example, the qubit readout circuitry 1200 comprises a control signal chain which comprises a waveform generator 1210 (or pulse envelope generator) which comprises digital-to-analog (DAC) circuitry 1211, low-pass filter circuitry 1212, a first I/Q mixer 1213 (upconverter or downconverter mixer), and a local oscillator (LO) signal generator 1214.

In addition, the qubit readout circuitry 1200 comprises readout signal chain which comprises an interferometric isolator circuit 1220, an interferometric directional quantum-limited amplifier (QLA) 1221, a filter 1222, a high-electron-mobility-transistor (HEMT) amplifier 1223, a second I/Q mixer 1224, and analog-to-digital converter (ADC) circuitry 1225, which outputs digital readout signals to a hardware or software-based discriminator to determine a readout state of the superconducting qubit 1204.

The waveform generator 1210 is configured to generate and output analog I and Q control signals with a given type of pulse envelope (e.g., Gaussian square pulse envelope) for qubit state readout, in response to a readout control signal. The analog I and Q control pulses are filtered by the low-pass filter circuitry 1212. The filtered analog control I and Q control pulses are applied to the first I/Q mixer 1213, along with an LO signal (LO_RO) that is generated by the LO signal generator 1214, to generate an RF readout control pulse RF_RO. In particular, the I/Q mixer 1213 is configured mix the analog I and Q control pulses with the LO_Q signals of a given LO frequency (e.g., 7 GHZ) to perform I/Q modulation and up-conversion and/or down-conversion using known techniques (e.g., single sideband modulation) to generate the RF readout control pulse RF_RO.

The RF readout control signal RF_RO is applied to an input port of the Purcell filter 1208, and then coupled to the readout resonator 1206. The readout resonator 1206 is capacitively coupled to the superconducting qubit 1204, thereby providing a qubit/resonator system. In some embodiments, the readout resonator 1206 comprises a coplanar waveguide resonator. For a readout operation, in some embodiments, the center frequency of the RF readout control signal RF_RO corresponds to the resonant frequency of the readout resonator 1206 to perform a dispersive qubit readout operation. In other embodiments, the frequency of RF_RO can be non-resonant with the readout resonator 1206 and still provide information about the qubit state.

In the dispersive regime of qubit-resonator coupling, the RF readout control signal RF_RO (with the requisite frequency tone, pulse envelope shape, and pulse duration) interacts with the given qubit-resonator device 1202 in a manner which results in the generation of a resulting readout signal RO that is reflected out from the readout resonator 1206, wherein the readout signal RO comprises information (e.g., phase and/or amplitude) that is qubit-state dependent. In other words, the dispersive readout process yields an RF readout signal RO having a state-dependent phasor response, which is analyzed to discriminate the quantum state of the superconducting qubit 1204.

The readout signal RO output from the readout resonator 1206 is coupled to the Purcell filter 1208, and then applied to the readout signal chain. The Purcell filter 1208 is designed, for example, to pass at the frequency of the readout signal RO while blocking the transmission of energy at the qubit frequency, to enhance the qubit lifetime, and perform other functions as understood by those of ordinary skill in the art. The readout signal RO is coupled out to the readout signal chain where the readout signal RO flows through the interferometric isolator circuit 1220 and is applied to an input port of the interferometric directional QLA 1221 which amplifies the readout signal RO. The amplified readout signal RO, which is output from the interferometric directional QLA 1221, is transmitted along a signal chain comprising the filter 1222 and another optional isolator circuit, amplified by the HEMT amplifier 1223, and applied to an input of the second I/Q mixer 1224. The second I/Q mixer 1224 mixes the RF readout signal RO with the LO_RO signal to perform a down conversion operation where the RF readout signal RO is down converted and split into analog I and Q signals. The analog I and Q signals are input to the ADC circuitry 1225 and sampled by the ADC circuitry 1225 to generate respective digital I and Q signals that are indicative of the amplitude and phase of the readout signal RO. A discriminator analyzes the digital I and Q signals to discriminate the measured quantum state of the superconducting qubit 1204 based on the amplitude and phase components of the readout signal RO.

It is to be understood that FIG. 12 is an exemplary non-limiting embodiment which schematically illustrates a high-level schematic illustration of readout control circuitry. The qubit readout circuitry 1200 and readout signal chain can be implemented using other components and configurations. For example, in some embodiments, when the Purcell filter 1208 is not implemented, a circulator or feedline can be implemented in FIG. 12 in place of the Purcell filter 1208. Further, a frequency-multiplexed readout system (which implements frequency domain multiplexing) can be utilized to scale-up a readout chain in a quantum computing system for reading the quantum states of superconducting qubits in relatively large superconducting quantum computers. In a frequency-multiplexed readout system, multiple readout resonators (with different resonance frequencies) are coupled to separate qubits and commonly coupled to a communication bus. The communication bus is configured to allow the transmission of multiple readout signals with readout frequencies which match the resonance frequencies of the readout resonators, and, thus simultaneously read out the quantum states of multiple qubits using one input and one output line.

In the exemplary embodiment of FIG. 12, the interferometric isolator circuit 1220 can be implemented using any of the exemplary interferometric isolator circuits as discussed herein (e.g., FIG. 5, 6, or 7). In addition, the interferometric directional QLA 1221 can be implemented using any of the exemplary interferometric directional amplifier circuits as discussed herein (e.g., FIG. 4). While the exemplary embodiment of FIG. 12 illustrates the implementation of both the interferometric isolator circuit 1220 and the interferometric directional QLA 1221, in other embodiments, the qubit readout circuitry 1200 can implement the interferometric isolator circuit 1220 in conjunction with any suitable quantum-limited amplifier such as a JTWPA in place of the interferometric directional QLA 1221. Moreover, in some embodiments, since the interferometric directional QLA 1221 provides isolation as well as quantum-limited amplification, the interferometric directional QLA 1221 can be implemented alone, without the need for implementing a separate isolation circuit (e.g., the interferometric isolator 1220) upstream of the interferometric directional QLA 1221.

Figure 13:
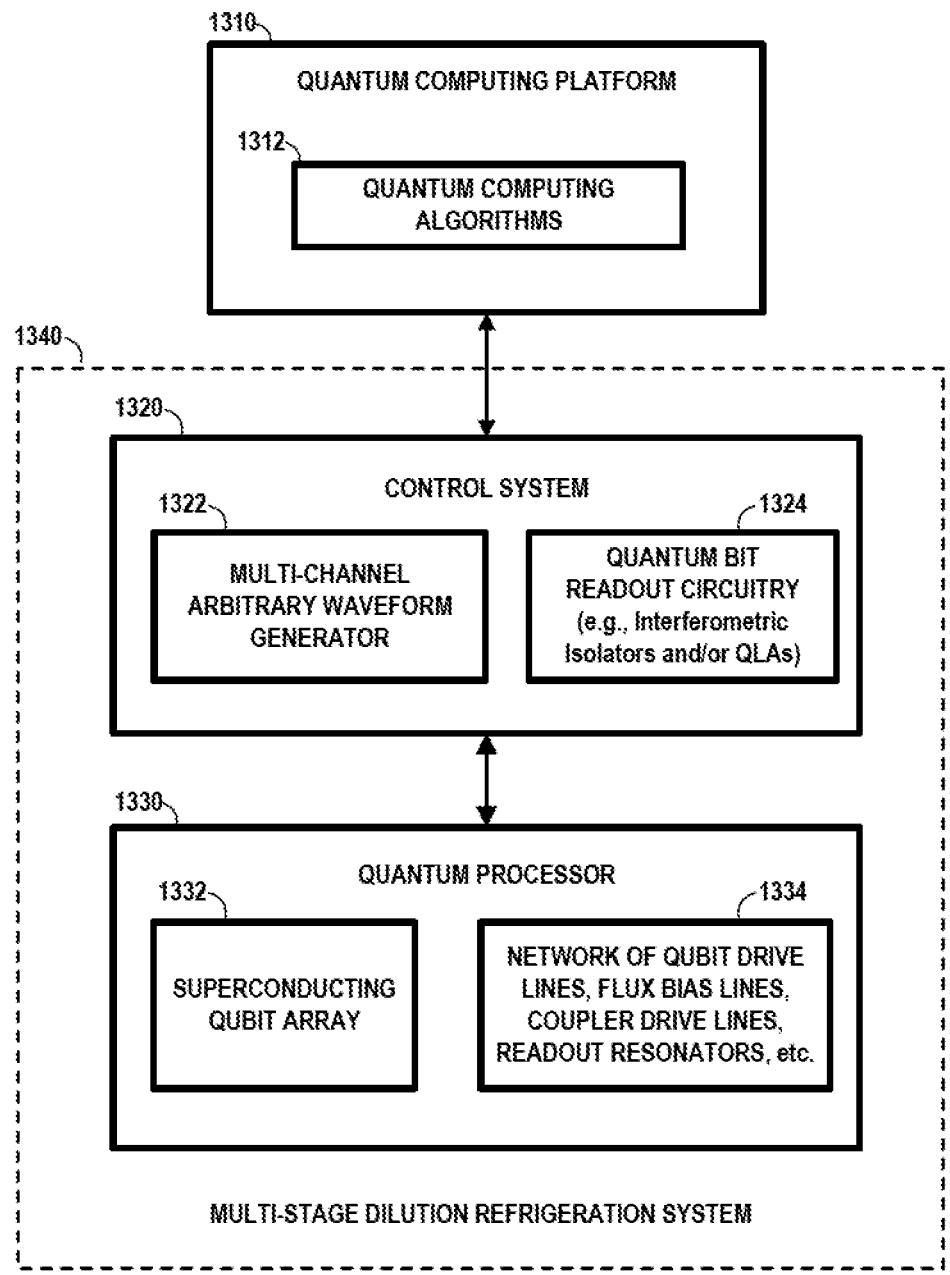
FIG. 13 schematically illustrates a quantum computing system, according to an exemplary embodiment of the disclosure.

FIG. 13 schematically illustrates a quantum computing system 1300 which comprises a quantum computing platform 1310, a control system 1320, and a quantum processor 1330. In some embodiments, the quantum computing platform 1310 implements a software platform that is configured to program a quantum computer to execute quantum computing algorithms 1312 which are implemented using, e.g., quantum circuits which define computational routings consisting of coherent quantum operations on quantum data, such as qubits. In addition, in some embodiments, the control system 1320 comprises a multi-channel arbitrary waveform generator 1322, and a quantum bit readout circuitry 1324. The quantum processor 1330 comprises one or more solid-state quantum chips which comprise, e.g., a superconducting qubit array 1332, and a network 1334 of qubit drive lines, coupler flux-bias control lines, qubit state readout lines, pump control lines, and other circuit QED components that may be needed for a given application or quantum system configuration. The quantum bit readout circuitry 1324 can include interferometric isolator circuits and/or interferometric directional amplifier circuits in each of a plurality of qubit readout signal chains that are implemented to readout the states of qubits of the superconducting qubit array 1332, such as discussed above in FIG. 12.

In some embodiments, the control system 1320 and the quantum processor 1330 are disposed in a dilution refrigeration system 1340 which can generate cryogenic temperatures that are sufficient to operate components of the control system 1320 for quantum computing applications. For example, the quantum processor 1330 may need to be cooled down to near-absolute zero, e.g., 10-15 millikelvin (mK), to allow the superconducting qubits to exhibit quantum behaviors. In some embodiments, the dilution refrigeration system 1340 comprises a multi-stage dilution refrigerator where the components of the control system 1320 can be maintained at different cryogenic temperatures, as needed. For example, while the quantum processor 1330 may need to be cooled down to, e.g., 10-15 mK, the circuit components of the control system 1320 may be operated at cryogenic temperatures greater than 10-15 mK (e.g., cryogenic temperatures in a range of 3K-4K), depending on the configuration of the quantum computing system.

In some embodiments, the superconducting qubit array 1332 comprises a quantum system of superconducting qubits, superconducting qubit couplers, and other components commonly utilized to support quantum processing using qubits. The number of superconducting qubits of the superconducting qubit array 1332 can be on the order of tens, hundreds, thousands, or more, etc. The network 1334 of qubit drive lines, coupler flux bias control lines, qubit state readout lines, etc., is configured to apply microwave control signals to superconducting qubits and coupler circuitry in the superconducting qubit array 1332 to perform various types of gate operations, e.g., single-gate operations, entanglement gate operations, perform error correction operations, etc., as well as read the quantum states of the superconducting qubits. For example, microwave control pulses are applied to the qubit drive lines of respective superconducting qubits to change the quantum state of the superconducting qubits (e.g., change the quantum state of a given qubit between the ground state and excited state, or to a superposition state) when executing quantum information processing algorithms.

Furthermore, as noted above, the state readout lines comprise readout resonators that are coupled to respective superconducting qubits. The state of a given superconducting qubit can be determined through microwave transmission or reflection measurements using the readout ports of the readout resonator. The states of the superconducting qubits are read out after executing a quantum algorithm. In some embodiments, as noted above, a dispersive readout operation is performed in which a change in the resonant frequency of a given readout resonator, which is coupled to a given superconducting qubit, is utilized to readout the state (e.g., ground or excited state) of the given superconducting qubit.

The network 1334 of qubit drive lines, coupler flux bias control lines, qubit state readout lines, etc., is coupled to the control system 1320 through a suitable hardware input/output (I/O) interface, which couples I/O signals between the control system 1320 and the quantum processor 1330. For example, the hardware I/O interface may comprise various types of hardware and components, such as RF cables, wiring, RF elements, optical fibers, heat exchanges, filters, amplifiers, isolators, etc.

In some embodiments, the multi-channel arbitrary waveform generator (AWG) 1322 and other suitable microwave pulse signal generators are configured to generate the microwave control pulses that are applied to the qubit drive lines, and the coupler drive lines to control the operation of the superconducting qubits and associated qubit coupler circuitry, when performing various gate operations to execute a given certain quantum information processing algorithm. In some embodiments, the multi-channel AWG 1322 comprises a plurality of AWG channels, which control respective superconducting qubits within the superconducting qubit array 1332 of the quantum processor 1330. In some embodiments, each AWG channel comprises a baseband signal generator, a digital-to-analog converter (DAC) stage, a filter stage, a modulation stage, an impedance matching network, and a phase-locked loop system to generate local oscillator (LO) signals (e.g., quadrature LO signals LO_I and LO_Q) for the respective modulation stages of the respective AWG channels.

In some embodiments, the multi-channel AWG 1322 comprises a quadrature AWG system which is configured to process quadrature signals, wherein a quadrature signal comprises an in-phase (I) signal component, and a quadrature-phase (Q) signal component. In each AWG channel the baseband signal generator is configured to receive baseband data as input (e.g., from the quantum computing platform), and generate digital quadrature signals I and Q which represent the input baseband data. In this process, the baseband data that is input to the baseband signal generator for a given AWG channel is separated into two orthogonal digital components including an in-phase (I) baseband component and a quadrature-phase (Q) baseband component. The baseband signal generator for the given AWG channel will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage for the given AWG channel is configured to convert a digital baseband signal (e.g., a digital IQ signal output from the baseband signal generator) to an analog baseband signal (e.g., analog baseband signals I(t) and Q(t)) having a baseband frequency. The filter stage for the given AWG channel is configured to filter the IQ analog signal components output from the DAC stage to thereby generate filtered analog IQ signals. The modulation stage for the given AWG channel is configured to perform analog IQ signal modulation (e.g., single-sideband (SSB) modulation) by mixing the filtered analog signals I(t) and Q(t), which are output from the filter stage, with quadrature LO signals (e.g., an in-phase LO signal (LO_I) and a quadrature-phase LO signal (LO_Q)) to generate and output an analog RF signal (e.g., a single-sideband modulated RF output signal).

In some embodiments, the quantum bit readout circuitry 1324 comprises a microwave pulse signal generator that is configured to apply a microwave tone to a given readout resonator line of a given superconducting qubit to perform a readout operation to readout the state of the given superconducting qubit, as well as circuitry that is configured to process the readout signal generated by the readout resonator line to determine the state of the given superconducting qubit, using techniques known to those of ordinary skill in the art. In some embodiments, the quantum bit readout circuitry 1324 is implemented based on the exemplary readout circuitry shown in FIG. 12.

The quantum computing platform 1310 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1310 comprises a hardware architecture of processors, memory, etc., which is configured to control the execution of quantum applications, and interface with the control system 1320 to (i) generate digital control signals that are converted to analog microwave control signals by the control system 1320, to control operations of the quantum processor 1330 when executing a given quantum application, and (ii) to obtain and process digital signals received from the control system 1320, which represent the processing results generated by the quantum processor 1330 when executing various gate operations for a given quantum application.

Figure 14:
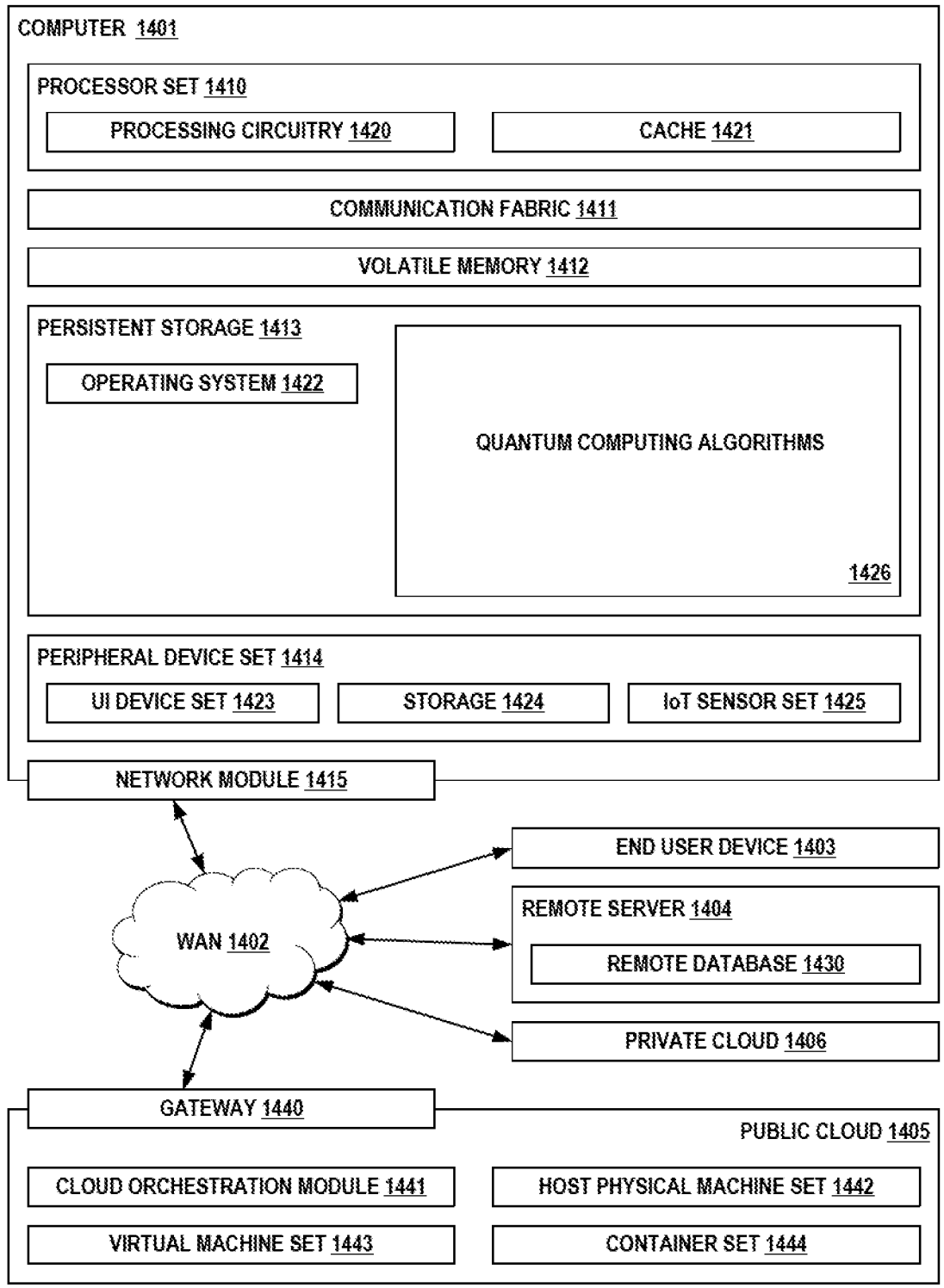
FIG. 14 schematically illustrates an exemplary architecture of a computing environment for hosting a quantum computing platform and performing quantum information processing, according to an exemplary embodiment of the disclosure.

In some exemplary embodiments, the quantum computing platform 1310 in FIG. 13 may be implemented using any suitable computing system architecture (e.g., as shown in FIG. 14) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1400 of FIG. 14 contains an example of an environment for the execution of at least some of the computer code (block 1426) involved in executing quantum computing algorithms (e.g., quantum computing algorithms 1312, FIG. 13). In addition to block 1426, computing environment 1400 includes, for example, computer 1401, wide area network (WAN) 1402, end user device (EUD) 1403, remote server 1404, public cloud 1405, and private cloud 1406. In this embodiment, computer 1401 includes processor set 1410 (including processing circuitry 1420 and cache 1421), communication fabric 1411, volatile memory 1412, persistent storage 1413 (including operating system 1422 and block 1426, as identified above), peripheral device set 1414 (including user interface (UI), device set 1423, storage 1424, and Internet of Things (IoT) sensor set 1425), and network module 1415. Remote server 1404 includes remote database 1430. Public cloud 1405 includes gateway 1440, cloud orchestration module 1441, host physical machine set 1442, virtual machine set 1443, and container set 1444.

Computer 1401 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1430. As is well understood in the art of computer technology, and depending upon the technology, performance of a computer-implemented method may be distributed among multiple computers and/or between multiple locations. On the other hand, in this presentation of computing environment 1400, detailed discussion is focused on a single computer, specifically computer 1401, to keep the presentation as simple as possible. Computer 1401 may be located in a cloud, even though it is not shown in a cloud in FIG. 14. On the other hand, computer 1401 is not required to be in a cloud except to any extent as may be affirmatively indicated.

Processor set 1410 includes one, or more, computer processors of any type now known or to be developed in the future. Processing circuitry 1420 may be distributed over multiple packages, for example, multiple, coordinated integrated circuit chips. Processing circuitry 1420 may implement multiple processor threads and/or multiple processor cores. Cache 1421 is memory that is located in the processor chip package(s) and is typically used for data or code that should be available for rapid access by the threads or cores running on processor set 1410. Cache memories are typically organized into multiple levels depending upon relative proximity to the processing circuitry. Alternatively, some, or all, of the cache for the processor set may be located "off chip." In some computing environments, processor set 1410 may be designed for working with qubits and performing quantum computing.

Computer readable program instructions are typically loaded onto computer 1401 to cause a series of operational steps to be performed by processor set 1410 of computer 1401 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1421 and the other storage media discussed below. The program instructions, and associated data, are accessed by processor set 1410 to control and direct performance of the inventive methods. In computing environment 1400, at least some of the instructions for performing the inventive methods may be stored in block 1426 in persistent storage 1413.

Communication fabric 1411 is the signal conduction paths that allow the various components of computer 1401 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1412 is any type of volatile memory now known or to be developed in the future. Examples include dynamic type random access memory (RAM) or static type RAM. Typically, the volatile memory is characterized by random access, but this is not required unless affirmatively indicated. In computer 1401, the volatile memory 1412 is located in a single package and is internal to computer 1401, but, alternatively or additionally, the volatile memory may be distributed over multiple packages and/or located externally with respect to computer 1401.

Persistent storage 1413 is any form of non-volatile storage for computers that is now known or to be developed in the future. The non-volatility of this storage means that the stored data is maintained regardless of whether power is being supplied to computer 1401 and/or directly to persistent storage 1413. Persistent storage 1413 may be a read only memory (ROM), but typically at least a portion of the persistent storage allows writing of data, deletion of data and re-writing of data. Some familiar forms of persistent storage include magnetic disks and solid-state storage devices. Operating system 1422 may take several forms, such as various known proprietary operating systems or open source Portable Operating System Interface type operating systems that employ a kernel. The code included in block 1426 typically includes at least some of the computer code involved in performing the inventive methods.

Peripheral device set 1414 includes the set of peripheral devices of computer 1401. Data communication connections between the peripheral devices and the other components of computer 1401 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1423 may include components such as a display screen, speaker, microphone, wearable devices (such as goggles and smart watches), keyboard, mouse, printer, touchpad, game controllers, and haptic devices. Storage 1424 is external storage, such as an external hard drive, or insertable storage, such as an SD card. Storage 1424 may be persistent and/or volatile. In some embodiments, storage 1424 may take the form of a quantum computing storage device for storing data in the form of qubits. In embodiments where computer 1401 is required to have a large amount of storage (for example, where computer 1401 locally stores and manages a large database) then this storage may be provided by peripheral storage devices designed for storing very large amounts of data, such as a storage area network (SAN) that is shared by multiple, geographically distributed computers. IoT sensor set 1425 is made up of sensors that can be used in Internet of Things applications. For example, one sensor may be a thermometer and another sensor may be a motion detector.

Network module 1415 is the collection of computer software, hardware, and firmware that allows computer 1401 to communicate with other computers through WAN 1402. Network module 1415 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1415 are performed on the same physical hardware device. In other embodiments (for example, embodiments that utilize software-defined networking (SDN)), the control functions and the forwarding functions of network module 1415 are performed on physically separate devices, such that the control functions manage several different network hardware devices. Computer readable program instructions for performing the inventive methods can typically be downloaded to computer 1401 from an external computer or external storage device through a network adapter card or network interface included in network module 1415.

WAN 1402 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1403 is any computer system that is used and controlled by an end user (for example, a customer of an enterprise that operates computer 1401), and may take any of the forms discussed above in connection with computer 1401. EUD 1403 typically receives helpful and useful data from the operations of computer 1401. For example, in a hypothetical case where computer 1401 is designed to provide a recommendation to an end user, this recommendation would typically be communicated from network module 1415 of computer 1401 through WAN 1402 to EUD 1403. In this way, EUD 1403 can display, or otherwise present, the recommendation to an end user. In some embodiments, EUD 1403 may be a client device, such as thin client, heavy client, mainframe computer, desktop computer and so on.

Remote server 1404 is any computer system that serves at least some data and/or functionality to computer 1401. Remote server 1404 may be controlled and used by the same entity that operates computer 1401. Remote server 1404 represents the machine(s) that collect and store helpful and useful data for use by other computers, such as computer 1401. For example, in a hypothetical case where computer 1401 is designed and programmed to provide a recommendation based on historical data, then this historical data may be provided to computer 1401 from remote database 1430 of remote server 1404.

Public cloud 1405 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1405 is performed by the computer hardware and/or software of cloud orchestration module 1441. The computing resources provided by public cloud 1405 are typically implemented by virtual computing environments that run on various computers making up the computers of host physical machine set 1442, which is the universe of physical computers in and/or available to public cloud 1405. The virtual computing environments (VCEs) typically take the form of virtual machines from virtual machine set 1443 and/or containers from container set 1444. It is understood that these VCEs may be stored as images and may be transferred among and between the various physical machine hosts, either as images or after instantiation of the VCE. Cloud orchestration module 1441 manages the transfer and storage of images, deploys new instantiations of VCEs and manages active instantiations of VCE deployments. Gateway 1440 is the collection of computer software, hardware, and firmware that allows public cloud 1405 to communicate through WAN 1402.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1406 is similar to public cloud 1405, except that the computing resources are only available for use by a single enterprise. While private cloud 1406 is depicted as being in communication with WAN 1402, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1405 and private cloud 1406 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, and to enable others of ordinary skill in the art to understand the embodiments disclosed herein.

What is claimed is:

1. A device, comprising:
   a superconducting parametric interferometric circuit comprising:
   a signal input port and a signal output port, the signal input port configured to receive an input signal having a first frequency;
   a first parametric mixing circuit and a second parametric mixing circuit coupled in parallel between the signal input port and the signal output port;
   wherein the first parametric mixing circuit is configured to convert the input signal to a first output signal having a second frequency, and the second parametric mixing circuit is configured to convert the input signal to a second output signal having the second frequency; and
   wherein superconducting parametric interferometric circuit is configured to constructively combine the first output signal and the second output signal at the signal output port to generate an output signal having the second frequency, and to provide isolation of the signal input port from a signal which is present at the signal output port.

2. The device of claim 1, wherein the superconducting parametric interferometric circuit comprises an interferometric isolator circuit which is configured to provide unity gain of the output signal, and to provide isolation by dissipating the signal which is present at the signal output port, in a terminated port of the superconducting parametric interferometric circuit.

3. The device of claim 1, wherein the superconducting parametric interferometric circuit comprises an interferometric directional amplifier circuit which is configured to provide an amplified output signal having the second frequency at the signal output port, and to provide isolation by dissipating the signal which is present at the signal output port, in a terminated port of the superconducting parametric interferometric circuit.

4. The device of claim 1, wherein the first parametric mixing circuit and the second parametric mixing circuit each comprise a parametric frequency converter circuit that is configured to one of: up-convert the first frequency to the second frequency and down-convert the first frequency to the second frequency.

5. The device of claim 4, wherein the parametric frequency converter circuit comprises a Josephson traveling-wave frequency converter circuit.

6. The device of claim 1, wherein the first parametric mixing circuit and the second parametric mixing circuit each comprise a parametric amplifier circuit.

7. The device of claim 6, wherein the parametric amplifier circuit comprises a Josephson traveling-wave parametric amplifier circuit.

8. The device of claim 1, wherein the first parametric mixing circuit is driven by a first pump signal and the second parametric mixing circuit is driven by a second pump signal, wherein the first pump signal and the second pump signal have a same frequency and one of: a same phase and a phase offset.

9. A device, comprising:
a superconducting interferometric isolation circuit comprising:
a signal input port and a signal output port, the signal input port configured to receive an input signal having a first frequency;
a frequency conversion circuit comprising a first parametric frequency converter circuit and a second parametric frequency converter circuit, which are serially cascaded; and
a delay circuit coupled in parallel with the frequency conversion circuit;
wherein the delay circuit is configured to delay the input signal to generate a first output signal having the first frequency with a first phase, and the frequency conversion circuit is configured to generate a second output signal having the first frequency and a second phase; and
wherein superconducting interferometric isolation circuit is configured to constructively combine the first output signal and the second output signal at the signal output port to generate an output signal having the first frequency, and to provide isolation of the signal input port from a signal which is present at the signal output port.

10. The device of claim 9, wherein the delay circuit comprises a passive delay line.

11. The device of claim 9, wherein the delay circuit comprise a passive filter circuit.

12. The device of claim 9, wherein one of the first parametric frequency converter circuit and the second parametric frequency converter circuit comprises a parametric frequency up-converter circuit, and the other of the first parametric frequency converter circuit and the second parametric frequency converter circuit comprises a parametric frequency down-converter circuit.

13. The device of claim 9, wherein the first parametric frequency converter circuit is driven by a first pump signal and the second parametric frequency converter circuit is driven by a second pump signal, wherein the first pump signal and the second pump signal have a same frequency and one of: a same phase and a phase offset.

14. A device, comprising:
a superconducting parametric interferometric circuit comprising:
a first hybrid coupler and a second hybrid coupler, the first hybrid coupler comprising a signal input port which is configured to receive an input signal having a first frequency, and the second hybrid coupler comprising a signal output port; and
a first parametric mixing circuit and a second parametric mixing circuit, which are coupled in parallel between the first hybrid coupler and the second hybrid coupler;
wherein the first hybrid coupler is configured to divide the input signal into a first input signal having the first frequency, and a second input signal having the first frequency;
wherein the first parametric mixing circuit is configured to convert the first input signal to a first output signal having a second frequency, and the second parametric mixing circuit is configured to convert the second input signal to a second output signal having the second frequency; and
wherein the second hybrid coupler is configured to combine the first output signal and the second output signal at the signal output port to generate an output signal having the second frequency.

15. The device of claim 14, wherein the first hybrid coupler and the second hybrid coupler each comprise a passive 90-degree hybrid coupler.

16. The device of claim 14, wherein the superconducting parametric interferometric circuit comprises an interferometric isolator circuit which is configured to provide unity gain of the output signal, and provide isolation of the signal input port from a signal which is present at the signal output port, by dissipating the signal, which is present at the signal output port, at a first terminated port of the first hybrid coupler.

17. The device of claim 14, wherein the superconducting parametric interferometric circuit comprises an interferometric directional amplifier circuit which is configured to provide an amplified output signal at the signal output port, and provide isolation of the signal input port from a signal which is present at the signal output port, by dissipating the signal, which is present at the signal output port, at a first terminated port of the first hybrid coupler.

18. The device of claim 14, wherein the first parametric mixing circuit and the second parametric mixing circuit each comprise a parametric frequency converter circuit that is configured to one of: up-convert the first frequency to the second frequency and down-convert the first frequency to the second frequency.

19. The device of claim 14, wherein the first parametric mixing circuit and the second parametric mixing circuit each comprise a parametric amplifier circuit.

20. The device of claim 14, wherein the first parametric mixing circuit is driven by a first pump signal and the second parametric mixing circuit is driven by a second pump signal, wherein the first pump signal and the second pump signal have a same frequency and one of: a same phase and a phase offset.

21. A device, comprising:
a superconducting interferometric isolation circuit comprising:
a first hybrid coupler and a second hybrid coupler, the first hybrid coupler comprising a signal input port which is configured to receive an input signal having a first frequency, and the second hybrid coupler comprising a signal output port; and a frequency conversion circuit comprising a first parametric frequency converter circuit and a second parametric frequency converter circuit, which are serially cascaded; and a delay circuit which is coupled in parallel with the frequency conversion circuit between the first hybrid coupler and the second hybrid coupler;

wherein the delay circuit is configured to group delay the input signal to generate a first output signal having the first frequency with a first phase, and the frequency conversion circuit is configured to generate a second output signal having the first frequency and a second phase; and wherein the second hybrid coupler is configured to constructively combine the first output signal and the second output signal at the signal output port to generate an output signal having the first frequency.

22. The device of claim 21, wherein the delay circuit comprises one of: a passive delay line and a passive filter circuit.

23. The device of claim 21, wherein:

one of the first parametric frequency converter circuit and the second parametric frequency converter circuit comprises a parametric frequency up-converter circuit, and the other of the first parametric frequency converter circuit and the second parametric frequency converter circuit comprises a parametric frequency down-converter circuit;

the first parametric frequency converter circuit is driven by a first pump signal and the second parametric frequency converter circuit is driven by a second pump signal; and the first pump signal and the second pump signal have a same frequency and one of: a same phase and a phase offset.

24. A system, comprising:

a quantum processor comprising quantum bits;

a readout signal path configured to transmit signals that are readout from one or more of the quantum bits of the quantum processor, the readout signal path comprising a superconducting parametric interferometric circuit, which comprises:

a signal input port and a signal output port, the signal input port configured to receive an input signal having a first frequency, the input signal comprising a readout signal of at least one quantum bit;

a first parametric mixing circuit and a second parametric mixing circuit coupled in parallel between the signal input port and the signal output port;

wherein the first parametric mixing circuit is configured to convert the input signal to a first output signal having a second frequency, and the second parametric mixing circuit is configured to convert the input signal to a second output signal having the second frequency; and wherein superconducting parametric interferometric circuit is configured to constructively combine the first output signal and the second output signal at the signal output port to generate an output signal having the second frequency, and to provide isolation of the signal input port from a signal which is present at the signal output port.

25. The system of claim 24, wherein the superconducting parametric interferometric circuit comprises one of: an interferometric isolator circuit which is configured to provide unity gain of the output signal, and an interferometric directional quantum-limited amplifier circuit which is configured to provide an amplified output signal at the signal output port.

* * * * *